(12) United States Patent
Akaiwa et al.

(10) Patent No.: US 10,256,099 B1
(45) Date of Patent: Apr. 9, 2019

(54) TRANSISTORS HAVING SEMICONDUCTOR-METAL COMPOSITE GATE ELECTRODES CONTAINING DIFFERENT THICKNESS INTERFACIAL DIELECTRICS AND METHODS OF MAKING THEREOF

(71) Applicant: SANDISK TECHNOLOGIES LLC, Plano, TX (US)

(72) Inventors: Jun Akaiwa, Yokkaichi (JP); Kiyokazu Shishido, Yokkaichi (JP); Hiroyuki Ogawa, Nagoya (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/916,720

(22) Filed: Mar. 9, 2018

(51) Int. Cl.
| | | |
|---|---|---|
| *H01L 21/28* | (2006.01) | |
| *H01L 21/265* | (2006.01) | |
| *H01L 27/088* | (2006.01) | |
| *H01L 29/49* | (2006.01) | |
| *H01L 29/78* | (2006.01) | |
| *H01L 21/3213* | (2006.01) | |

(Continued)

(52) U.S. Cl.
CPC .... *H01L 21/28052* (2013.01); *H01L 21/2652* (2013.01); *H01L 21/3086* (2013.01); *H01L 21/32139* (2013.01); *H01L 27/088* (2013.01); *H01L 29/4958* (2013.01); *H01L 29/66833* (2013.01); *H01L 29/7832* (2013.01); *H01L 29/7851* (2013.01); *H01L 29/7855* (2013.01); *H01L 2924/13067* (2013.01)

(58) Field of Classification Search
CPC ........... H01L 21/28052; H01L 29/7855; H01L 21/3086; H01L 21/32139; H01L 29/7851; H01L 29/66833; H01L 29/7832; H01L 29/4958; H01L 27/088; H01L 21/2652; H01L 2924/13067
See application file for complete search history.

(56) References Cited

U.S. PATENT DOCUMENTS

| | | | |
|---|---|---|---|
| 9,105,694 B2 * | 8/2015 | Lee | ................. H01L 21/76843 |
| 9,570,463 B1 | 2/2017 | Zhang et al. | |
| 9,859,422 B2 | 1/2018 | Nishikawa et al. | |

(Continued)

OTHER PUBLICATIONS

U.S. Appl. No. 15/593,916, filed May 12, 2017, SanDisk Technologies Inc.

(Continued)

*Primary Examiner* — Karen Kusumakar
(74) *Attorney, Agent, or Firm* — The Marbury Law Group PLLC

(57) ABSTRACT

A semiconductor structure, such as a CMOS device, includes a first field effect transistor and a second field effect transistor. The first field effect transistor includes a first composite gate electrode containing a first vertical stack of a p-doped semiconductor gate electrode, a first interfacial dielectric layer, and a first metallic gate electrode. The second field effect transistor includes a second composite gate electrode containing a second vertical stack that includes an n-doped semiconductor gate electrode and a second metallic gate electrode. A second interfacial dielectric layer having a second thickness that is thinner than the first interfacial dielectric layer may, or may not, be present in the second composite gate electrode.

20 Claims, 19 Drawing Sheets

(51) Int. Cl.
*H01L 21/308* (2006.01)
*H01L 29/66* (2006.01)

(56) References Cited

U.S. PATENT DOCUMENTS

| | | | |
|---|---|---|---|
| 2007/0152276 A1* | 7/2007 | Arnold | H01L 21/823842 257/369 |
| 2007/0178634 A1* | 8/2007 | Jung | H01L 21/28088 438/199 |
| 2008/0099851 A1* | 5/2008 | Hsu | H01L 29/7833 257/369 |
| 2009/0256211 A1* | 10/2009 | Booth, Jr. | H01L 21/823842 257/407 |
| 2011/0256700 A1* | 10/2011 | Chang | H01L 21/82345 438/585 |
| 2013/0005133 A1* | 1/2013 | Lee | H01L 29/66545 438/595 |
| 2016/0351709 A1 | 12/2016 | Nishikawa et al. | |

OTHER PUBLICATIONS

U.S. Appl. No. 15/617,499, filed Jun. 8, 2017, SanDisk Technologies Inc.

Sayama, H. et al., "Low voltage operation of sub-quarter micron W-polycide dual gate CMOS with non-uniformly doped channel", Proceedings of the International Electron Device Meeting, Dec. 8 to 11, 1996, pp. 583-586, (1996).

\* cited by examiner

TRANSISTORS HAVING SEMICONDUCTOR-METAL COMPOSITE GATE ELECTRODES CONTAINING DIFFERENT THICKNESS INTERFACIAL DIELECTRICS AND METHODS OF MAKING THEREOF

FIELD

The present disclosure generally relates to semiconductor devices, and particularly to field effect transistors including different thickness interfacial dielectrics located in respective semiconductor-metal composite gate electrodes and methods of manufacturing the same.

BACKGROUND

Composite gate electrodes including a stack of a semiconductor electrode and a metal electrode provide the benefit of providing optimal work functions for p-type field effect transistors and n-type transistors through suitable doping of a semiconductor material and providing low overall resistance for the gate electrodes.

SUMMARY

According to an aspect of the present disclosure, a semiconductor structure comprises a first field effect transistor and a second field effect transistor. The first field effect transistor comprises a first source region, a first drain region, a first channel region located between the first source region and the first drain region, a first gate dielectric and a first composite gate electrode comprising a first vertical stack of a p-doped semiconductor gate electrode, a first interfacial dielectric layer having a first thickness, and a first metallic gate electrode. The second field effect transistor comprises a second source region, a second drain region, a second channel region located between the second source region and the second drain region, a second gate dielectric, and a second composite gate electrode comprising a second vertical stack comprising an n-doped semiconductor gate electrode and a second metallic gate electrode. In one embodiment, no interfacial dielectric layer located in an interfacial region between the n-doped semiconductor gate electrode and the second metallic gate electrode. In another embodiment, a second interfacial dielectric layer having a second thickness that is less than the first thickness located in the interfacial region between the n-doped semiconductor gate electrode and the second metallic gate electrode.

According to another aspect of the present disclosure, a method of forming a semiconductor structure is provided, which comprises: forming a continuous gate dielectric layer and a gate semiconductor layer over a top surface of a semiconductor substrate; forming a p-doped semiconductor region and an n-doped semiconductor region in the gate semiconductor layer by doping portions of the gate semiconductor layer with p-type dopants or n-type dopants; forming an interfacial dielectric material on the p-doped semiconductor region and on the n-doped semiconductor region; covering a first portion of the interfacial dielectric material from above the p-doped semiconductor region with an etch mask layer and removing a second portion of the interfacial dielectric material from above the n-doped semiconductor region; forming a metallic gate layer over the first portion of the interfacial dielectric material, the p-doped semiconductor region, and the n-doped semiconductor region after removing the etch mask layer; and patterning the metallic gate layer, the second portion of the interfacial dielectric material, the p-doped semiconductor region, and the n-doped semiconductor region, which provides: a first composite gate electrode including a first vertical stack of a p-doped semiconductor gate electrode including a remaining portion of the p-doped semiconductor region, a first interfacial dielectric layer having a first thickness and including a remaining portion of the second portion of the interfacial dielectric material, and a first metallic gate electrode including a portion of the metallic gate layer; and a second composite gate electrode including a second vertical stack comprising an n-doped semiconductor gate electrode including a remaining portion of the n-doped semiconductor region and a second metallic gate electrode including another portion of the metallic gate layer. An interfacial region between the n-doped semiconductor gate electrode and the second metallic gate electrode has a configuration selected from: a first configuration in which a second interfacial dielectric layer having a second thickness that is less than the first thickness contacts a surface of the n-doped semiconductor gate electrode and a surface of the second metallic gate electrode; and a second configuration in which a surface of the n-doped semiconductor gate electrode contacts a surface of the second metallic gate electrode.

DETAILED DESCRIPTION

The present inventors realized that diffusion of dopant atoms from the semiconductor electrode into the metal electrode of the composite gate electrode during thermal processing steps increases interfacial resistance between the semiconductor electrode and the metal electrode. Such increase in the interfacial resistance increases in gate contact resistance, and adversely impacts performance of the field effect transistors. In one embodiment of the present disclosure, field effect transistors contain different thickness interfacial dielectrics in the composite gate electrodes or an interfacial dielectric just in the composite gate electrode of the PMOS transistors but not in the composite gate electrodes of the NMOS transistors, the various aspects of which are described below. The embodiments of the disclosure can be employed to form various semiconductor structures which contain the field effect transistors, such as CMOS devices for driver circuits of a non-volatile memory device, in which the memory cells are located over the CMOS devices.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous contiguous structure that has a thickness less than the thickness of the contiguous structure. For example, a layer may be located between any pair of horizontal planes between, or at, a top surface and a bottom surface of the contiguous structure. A layer may extend horizontally, vertically, and/or along a tapered surface. A substrate may be a layer, may include one or more layers therein, and/or may have one or more layer thereupon, thereabove, and/or therebelow.

Figure 1:
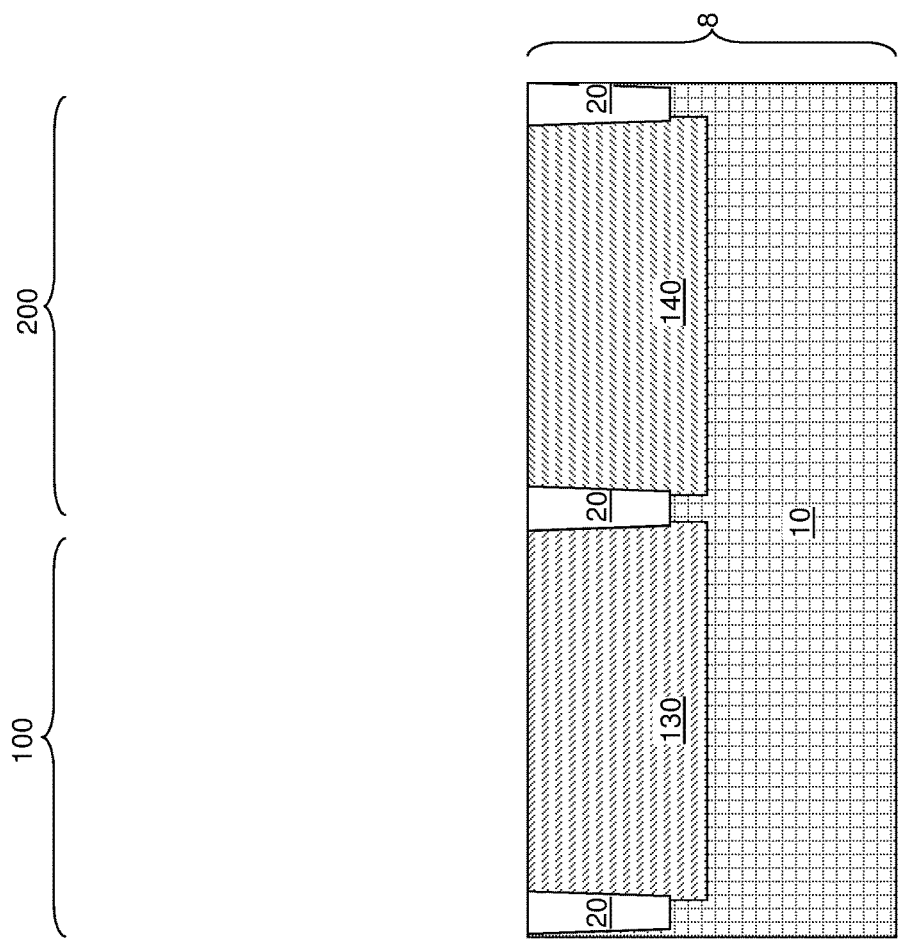
FIG. 1 is a vertical cross-sectional view of an exemplary semiconductor structure after formation of doped wells and shallow trench isolation structures in a semiconductor substrate according to an embodiment of the present disclosure.

Referring to FIG. 1, an exemplary semiconductor structure is illustrated. The exemplary semiconductor structure comprises a substrate 8 including a semiconductor material layer 10. The semiconductor material layer 10 can include at least one elemental semiconductor material, at least one III-V compound semiconductor material, at least one II-VI compound semiconductor material, at least one organic semiconductor material, or other semiconductor materials known in the art. The semiconductor material layer 10 can be a single crystalline semiconductor material layer. In one embodiment, the semiconductor material layer 10 can be a single crystalline silicon layer.

The semiconductor material layer 10 may be initially formed as a layer having a uniform thickness. The semiconductor material layer 10 can be a semiconductor substrate (i.e., a bulk semiconductor substrate, such as a silicon wafer), or can be a portion of a substrate. In case the semiconductor material layer 10 is an uppermost layer of a substrate including at least one underlying material layer, the at least one underlying material layer can include another semiconductor material layer (e.g., a silicon wafer located under an epitaxial silicon layer 10) and/or an insulator layer and/or a conductive material layer. For example, the semiconductor material layer 10 can be a strained or relaxed semiconductor material layer with epitaxial alignment with an underlying semiconductor material layer having a different lattice constant than the semiconductor material layer 10. Alternately, the semiconductor material layer 10 can be a top semiconductor layer in a semiconductor-on-insulator (SOI) substrate. The semiconductor material layer 10 can be intrinsic, p-doped, or n-doped. If p-doped or n-doped, the semiconductor material layer 10 can have a dopant concentration in a range from $1.0\times10^{14}/cm^3$ to $1.0\times10^{18}/cm^3$, although lesser and greater dopant concentrations can also be employed.

As used herein, a "semiconductor material" refers to a material having electrical conductivity in the range from $1.0\times10^{-6}$ S/cm to $1.0\times10^5$ S/cm, and is capable of producing a doped material having electrical resistivity in a range from 1.0 S/cm to $1.0\times10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^5$ S/cm. As used herein, an "insulator material" or a "dielectric material" refers to a material having electrical conductivity less than $1.0\times10^{-6}$ S/cm. All measurements for electrical conductivities are made at the standard condition.

At least one doped semiconductor well (130, 140) can be formed within the semiconductor material layer 10, for example, by implanting electrical dopants of various conductivity types into surface portions of the semiconductor material layer 10. Patterned photoresist layers (not shown) can be employed as masking layers during various ion implantation processes. Each patterned photoresist layer can be formed prior to a respective ion implantation process, and can be removed, for example, by ashing after the respective ion implantation process. The electrical dopants can include p-type dopants and n-type dopants. Each implanted portion of the semiconductor material layer 10 can be converted into a doped semiconductor well (130, 140). Each doped semiconductor well (130, 140) can be p-doped, or n-doped, and can have a dopant concentration in a range from $1.0\times10^{15}/cm^3$ to $1.0\times10^{19}/cm^3$, although lesser and greater dopant concentrations can also be employed. While the present disclosure is described employing two doped semiconductor wells, embodiments are expressly contemplated in which one or more of the four doped semiconductor wells and devices thereupon are omitted.

In an illustrative example, the at least one doped semiconductor well (130, 140) can comprise a first doped semiconductor well 130 located in a first device region 100, and a second doped semiconductor well 140 located in a second device region 200. In one embodiment. The first doped semiconductor well 130 can have a doping of a first conductivity type, and the second doped well 140 can have a doping of a second conductivity type that is the opposite of the first conductivity type. In one embodiment, the first conductivity type can be n-type and the second conductivity type can be p-type, such that the first doped semiconductor well 130 is an n-doped well and the second doped well 140 is a p-doped well. Alternatively, the first conductivity type can be p-type and the second conductivity type can be n-type.

Optionally, shallow trench isolation structures 20 can be formed to provide electrical isolation among devices to be subsequently formed. In one embodiment, the shallow trench isolation structures 20 can be formed at boundaries among the doped semiconductor wells (130, 140).

Figure 2:
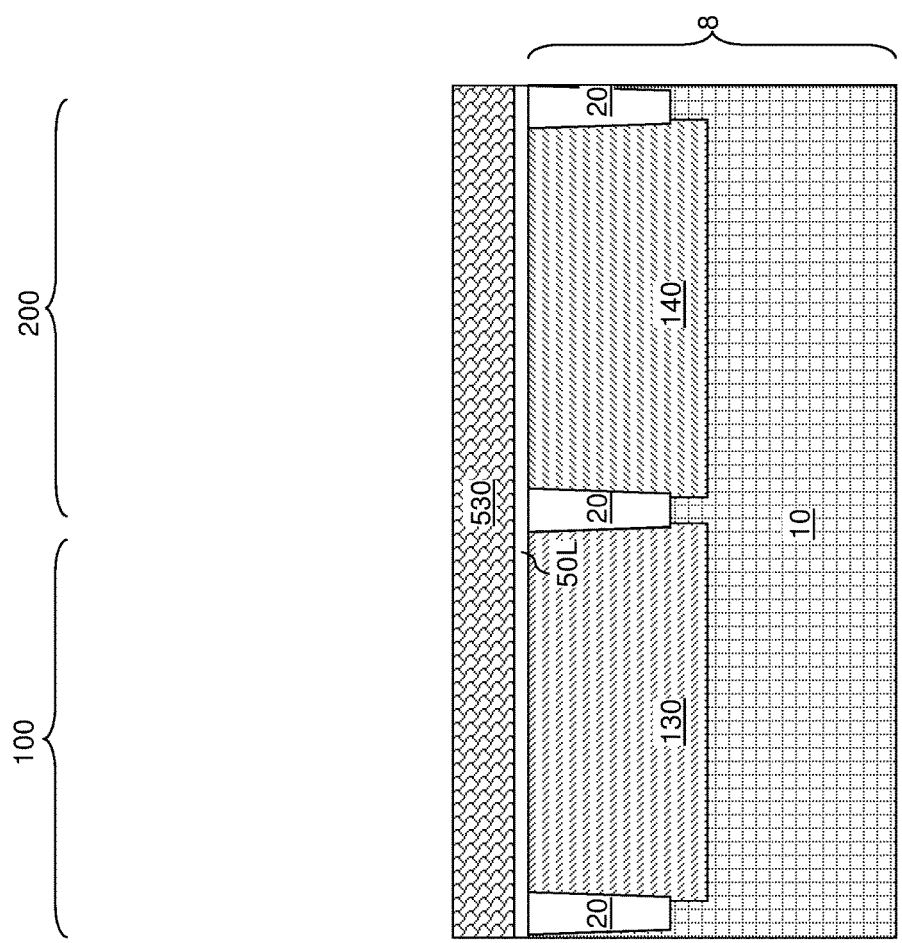
FIG. 2 is a vertical cross-sectional view of the exemplary structure after formation of a continuous gate dielectric layer and a gate semiconductor layer over the semiconductor substrate according to an embodiment of the present disclosure.

Referring to FIG. 2, gate stack layers (50L, 530) are formed on the top surface of the substrate 8. The gate stack layers (50L, 530) can include, for example, a continuous gate dielectric layer 50L and a gate semiconductor layer 530. The continuous gate dielectric layer 50L may be formed as a single gate dielectric material layer, or may be formed as a layer stack of multiple gate dielectric material layers. For example, the continuous gate dielectric layer 50L may consist essentially of silicon oxide or silicon oxynitride, or include a layer stack containing a dielectric metal oxide layer (such as a hafnium oxide layer or an aluminum oxide layer) and at least one of a silicon oxide layer and a silicon oxynitride layer. The continuous gate dielectric layer 50L may have a same composition and thickness across the first device region 100 and the second device region 200, or may have different compositions and/or different thicknesses across the first device region 100 and the second device region 200. The continuous gate dielectric layer 50L can be formed by at least one conformal formation process such as thermal oxidation, thermal nitridation, a chemical vapor deposition process, and/or an atomic layer deposition process. The thickness of the continuous gate dielectric layer 50L can be in a range from 1.0 nm to 10 nm, such as from 1.5 nm to 6 nm, although lesser and greater thicknesses can also be employed.

The gate semiconductor layer 530 includes a silicon-containing semiconductor material such as amorphous silicon, polysilicon, germanium-doped silicon, carbon-doped silicon, or silicon doped with germanium and carbon. In one embodiment, the silicon-containing semiconductor material of the gate semiconductor layer 530 can include silicon atoms at an atomic concentration greater than 80%, greater than 90%, greater than 95%, greater than 98%, greater than 99%, greater than 99.8%, and/or greater than 99.9%. In one embodiment, the gate semiconductor layer 530 can consist essentially of Group IV elements.

In one embodiment, the gate semiconductor layer 530 can include an intrinsic silicon-containing semiconductor material. Alternatively, the gate semiconductor layer 530 can include p-type dopants or n-type dopants at an atomic concentration in a range from $1.0\times10^{14}/cm^3$ to $1.0\times10^{21}/cm^3$, such as from $1.0\times10^{17}/cm^3$ to $5.0\times10^{20}/cm^3$, although lesser and greater dopant concentrations can also be employed.

The gate semiconductor layer 530 can be formed by chemical vapor deposition (CVD), physical vapor deposition (PVD), or vacuum evaporation. In one embodiment, the gate semiconductor layer 530 can be deposited by low pressure chemical vapor deposition (LPCVD). The thickness of the gate semiconductor layer 530 can be in a range from 50 nm to 300 nm, although lesser and greater thicknesses can also be employed.

Figure 3:
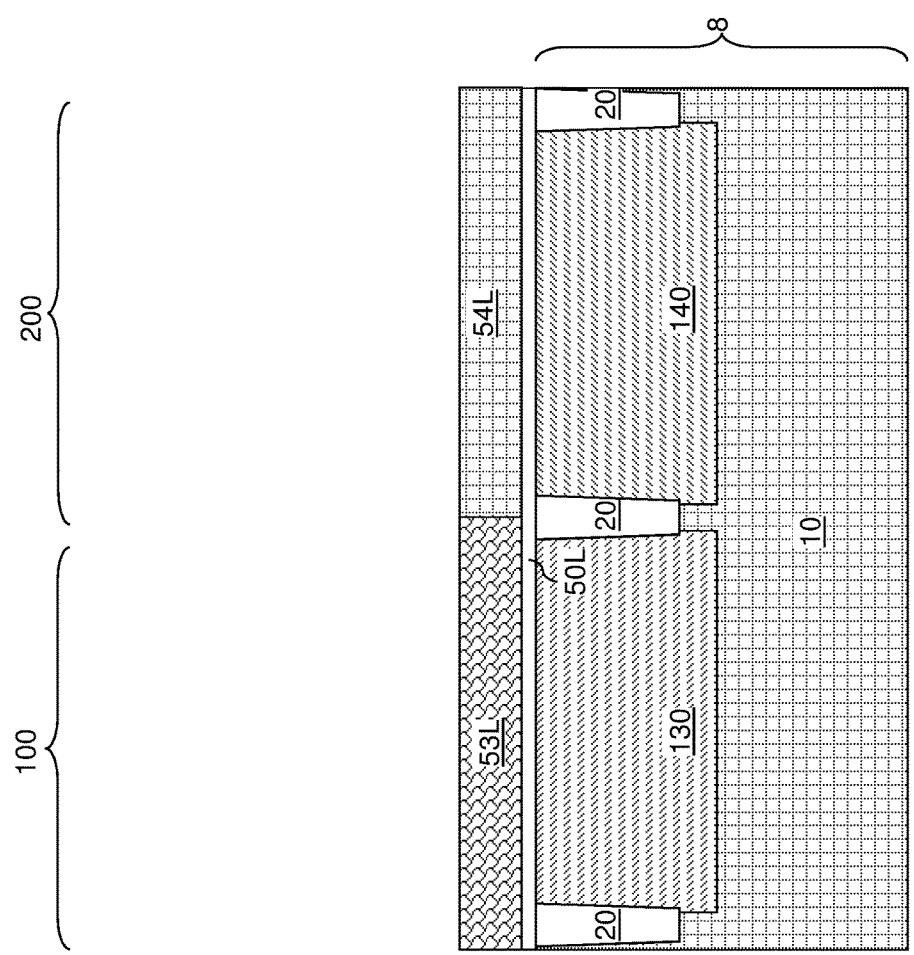
FIG. 3 is a vertical cross-sectional view of the exemplary structure after formation of a p-doped semiconductor region and an n-doped semiconductor region in the gate semiconductor layer according to an embodiment of the present disclosure.

Referring to FIG. 3, various regions of the gate semiconductor layer 530 can be doped with dopants of a suitable conductivity type. For example, for an intrinsic gate semiconductor layer 530, a first patterned photoresist layer can be formed to cover the portion of the gate semiconductor layer 530 in the second device region 200, and suitable dopants can be implanted into the portion of the gate semiconductor layer 530 in the first device region 100. In one embodiment, the implanted dopants can be p-type dopants, and the implanted portion of the gate semiconductor layer 530 in the first device region 100 can become a p-doped semiconductor region 53L. The first patterned photoresist layer can be removed, for example, by ashing.

Likewise, a second patterned photoresist layer can be formed to cover the portion of the gate semiconductor layer 530 in the first device region 100 (which may be the p-doped semiconductor region 53L), and suitable dopants can be implanted into the portion of the gate semiconductor layer 530 in the second device region 200. In one embodiment, the implanted dopants can be n-type dopants, and the implanted portion of the gate semiconductor layer 530 in the second device region 200 can become an n-doped semiconductor region 54L. The second patterned photoresist layer can be removed, for example, by ashing. It is understood that the order of formation of the p-doped semiconductor region 53L and the n-doped semiconductor region 54L may be reversed.

The p-doped semiconductor region 53L can include p-type dopants at an atomic concentration in a range from $1.0\times10^{14}/cm^3$ to $1.0\times10^{21}/cm^3$, such as from $1.0\times10^{17}/cm^3$ to $5.0\times10^{20}/cm^3$, although lesser and greater dopant concentrations can also be employed. In one embodiment, the p-doped semiconductor region 53L can include p-type dopants at an atomic concentration in a range from $1.0\times10^{19}/cm^3$ to $5.0\times10^{20}/cm^3$. In one embodiment, the p-doped semiconductor region 53L can consist essentially of p-doped silicon (e.g., p-doped polysilicon). The n-doped semiconductor region 54L can include n-type dopants at an atomic concentration in a range from $1.0 \times 10^{14}/cm^3$ to $1.0 \times 10^{21}/cm^3$, such as from $1.0 \times 10^{17}/cm^3$ to $5.0 \times 10^{20}/cm^3$, although lesser and greater dopant concentrations can also be employed. In one embodiment, the n-doped semiconductor region 54L can include n-type dopants at an atomic concentration in a range from $1.0 \times 10^{19}/cm^3$ to $5.0 \times 10^{20}/cm^3$. In one embodiment, the n-doped semiconductor region 54L can consist essentially of n-doped silicon (e.g., n-doped polysilicon).

In an alternative embodiment, the gate semiconductor layer 530 may be formed as a p-doped silicon-containing semiconductor layer or as an n-doped silicon-containing semiconductor layer. The atomic concentration of p-type dopants or n-type dopants in the gate semiconductor layer 530 can be in a range from $1.0 \times 10^{14}/cm^3$ to $1.0 \times 10^{21}/cm^3$, such as from $1.0 \times 10^{17}/cm^3$ to $5.0 \times 10^{20}/cm^3$, although lesser and greater dopant concentrations can also be employed. In this case, a masked ion implantation process can be performed to implant dopants of the opposite conductivity type only in the device region which the conductivity needs to change. For example, if the gate semiconductor layer 530 is formed as a p-doped semiconductor material layer, then n-type dopants (e.g., phosphorus or arsenic) can be implanted in the second device region 200 at a dose that is high enough to change the conductivity type of the implanted region from p-type to n-type. Alternatively, if the gate semiconductor layer 530 is formed as an n-doped semiconductor material layer, then p-type dopants (e.g., boron) can be implanted in the first device region 100 at a dose that is high enough to change the conductivity type of the implanted region from n-type to p-type.

The conductivity types of the first doped semiconductor well 130 and the second doped semiconductor well 140 can be selected based the types of field effect transistors to be subsequently formed. The conductivity types of the first doped semiconductor well 130 and the second doped semiconductor well 140 can be independent of each other, or may be correlated to each other. The first doped semiconductor well 130 and the second doped semiconductor well 140 can be independently p-doped and/or n-doped. In one embodiment, a p-type field effect transistor including a p-doped semiconductor gate electrode and an n-doped well 130 can be formed in the first device region 100, and an n-type field effect transistor including a n-doped semiconductor gate electrode and a p-doped well 140 can be formed in the second device region 200. In this case, the first doped semiconductor well 130 can be an n-doped well, and the second doped semiconductor well 140 can be a p-doped well.

Generally, p-doped semiconductor region 53L and an n-doped semiconductor region 54L can be formed in the gate semiconductor layer 530 by doping portions of the gate semiconductor layer 530 with p-type dopants or n-type dopants either during or after formation of the gate semiconductor layer 530. In one embodiment, the p-doped semiconductor region 53L can include, or can consist essentially of, boron-doped polysilicon, and the n-doped semiconductor gate 54L can include, or can consist essentially of, n-doped polysilicon. In one embodiment, the p-doped semiconductor region 53L and an n-doped semiconductor region 54L can have a same thickness, and top surfaces of the p-doped semiconductor region 53L and an n-doped semiconductor region 54L can be vertically offset from the top surface of the substrate 8 by a same vertical separation distance.

Figure 4:
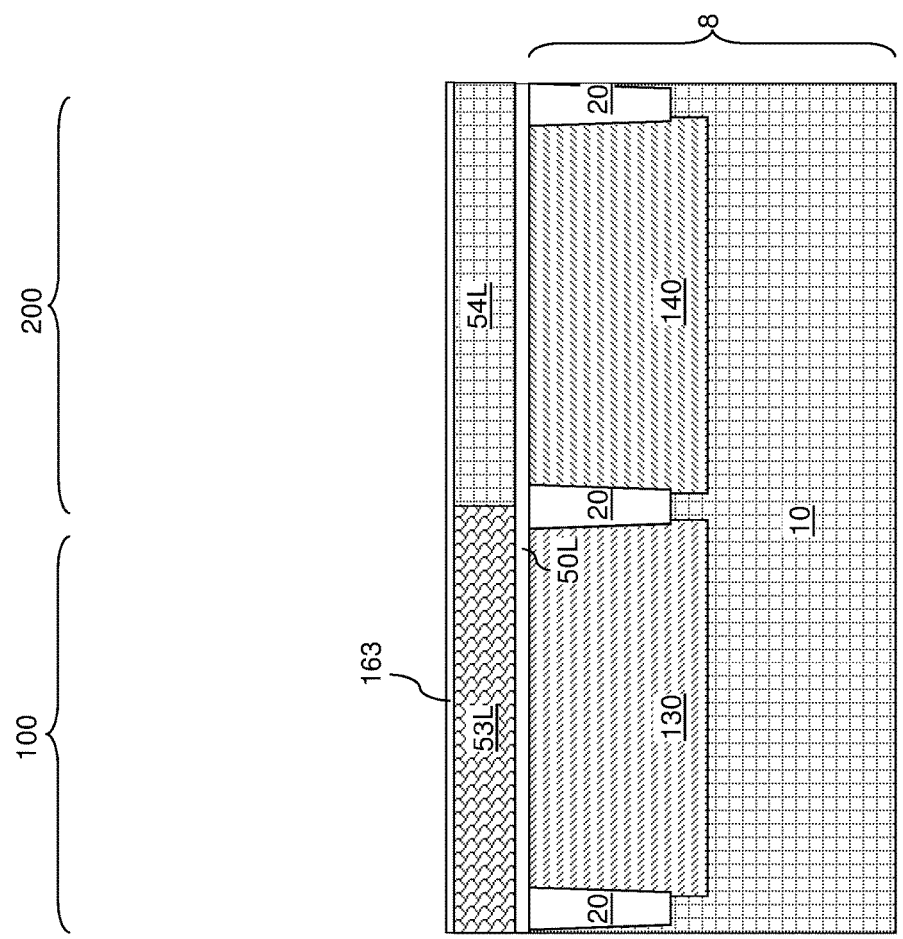
FIG. 4 is a vertical cross-sectional view of the exemplary structure after formation of an in-process interfacial dielectric material layer according to an embodiment of the present disclosure.

Referring to FIG. 4, a dielectric material layer can be formed on the top surfaces of the p-doped semiconductor region 53L and an n-doped semiconductor region 54L by a conformal formation process. The dielectric material layer is herein referred to as an in-process interfacial dielectric material layer 163. The in-process interfacial dielectric material layer 163 subsequently functions as a portion of an interfacial material layer between a metallic gate electrode to be formed and each of the p-doped semiconductor region 53L and optionally the n-doped semiconductor region 54L. As used herein, an "in-process" element refers to an element that is modified in structure and/or in composition in a subsequent processing step.

The in-process interfacial dielectric material layer 163 includes an interfacial dielectric material, and is formed directly on top surfaces of the p-doped semiconductor region 53L and directly on top surfaces of the n-doped semiconductor region 54L. The interfacial dielectric material can be formed by thermal oxidation of surface portions of the p-doped semiconductor region 53L and the n-doped semiconductor region 54L. The thickness of the in-process interfacial dielectric material layer 163 can be selected such that the in-process interfacial dielectric material layer 163 is not effective as an electrically insulating structure. Specifically, the thickness of the in-process interfacial dielectric material layer 163 can be selected such that leakage current, such as tunneling current, through the in-process interfacial dielectric material layer 163 is at a level that renders the in-process interfacial dielectric material layer 163 ineffective as an electrically insulating structure. As such, the in-process interfacial dielectric material layer 163 is a surface layer that does not function as a charge trapping structure or a tunneling barrier structure.

In an illustrative example, the in-process interfacial dielectric material layer 163 can have a thickness that provides leakage of electrical charges thereacross with a time constant less than 1 millisecond, such as less than 1 microsecond and/or less than 1 nanosecond. For example, the in-process interfacial dielectric material layer 163 can be a thermal silicon oxide layer that may be thicker than a native silicon oxide layer formed at room temperature, and may have a thickness in a range from 0.5 nm to 1.5 nm, such as from 0.6 nm to 0.12 nm, although lesser and greater thicknesses can also be employed.

Thermal oxidation of doped silicon generally induces incorporation of the dopants in the doped silicon into the silicon oxide material formed by the thermal oxidation. A segregation coefficient is defined as the ratio of the atomic concentration of dopant atoms in silicon to the atomic concentration of atoms in the silicon oxide material formed by thermal oxidation. For boron atoms, which are p-type dopants, the segregation coefficient is less than 1, and is typically around 0.3. For phosphorus, arsenic, and antimony, which are n-type dopants, the segregation coefficient is greater than 1.

In one embodiment, the p-doped semiconductor region 53L includes, and/or consists essentially of, boron-doped polysilicon, and the n-doped semiconductor region 54L includes, and/or consists essentially of, n-doped polysilicon. A first portion of the interfacial dielectric material in the in-process interfacial dielectric material layer 163 includes, and/or consists essentially of, a first thermal silicon oxide having a p-type doping and located on the p-doped semiconductor region 53L. A second portion of the interfacial dielectric material in the in-process interfacial dielectric material layer 163 includes, and/or consists essentially of, a second thermal silicon oxide having an n-type doping and located on the n-doped semiconductor region 54L.

In one embodiment, the p-doped semiconductor region 53L can include boron atoms at a first atomic boron concentration, and a portion of the in-process interfacial dielectric material layer 163 located in the first device region 100 includes boron atoms at a second atomic boron concentration that is the same as, or greater than, the first atomic boron concentration. In one embodiment, the n-doped semiconductor region 54L can include n-type dopant atoms at a third atomic boron concentration, and a portion of the in-process interfacial dielectric material layer 163 located in the second device region 200 includes n-type dopant atoms at a fourth atomic boron concentration that is the same as, or less than, the third atomic boron concentration.

Figure 5:
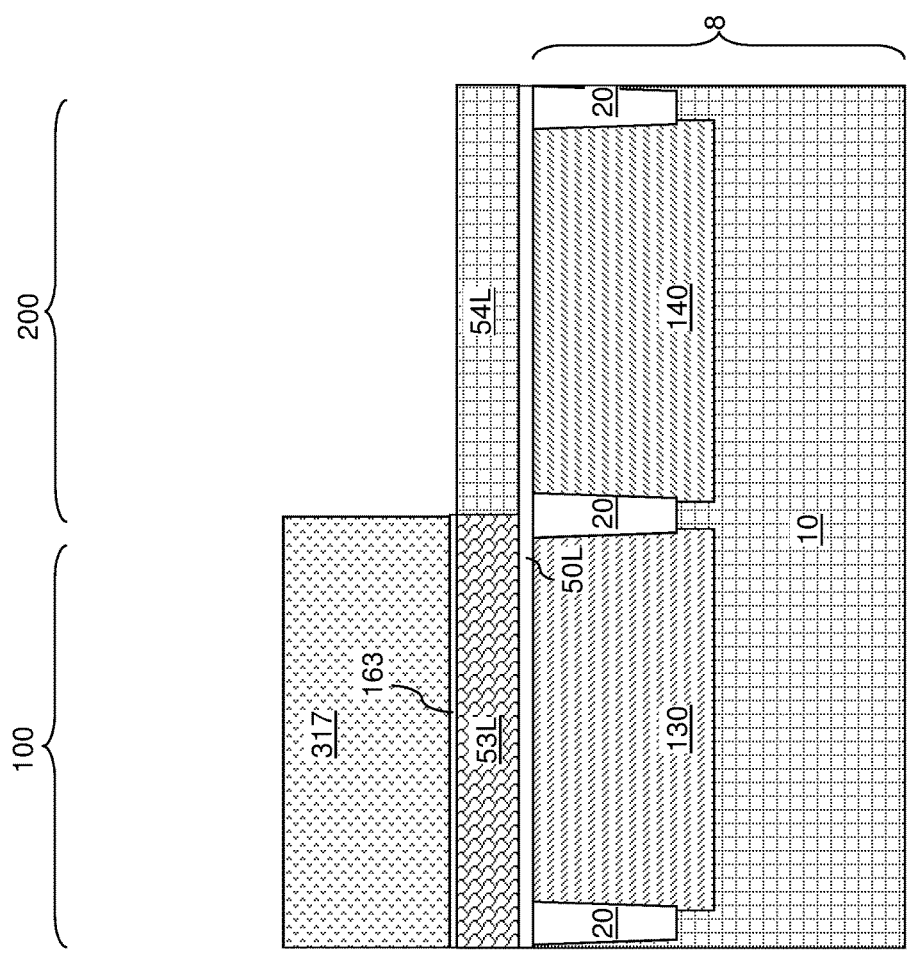
FIG. 5 is a vertical cross-sectional view of the exemplary structure after covering a first portion of the in-process interfacial dielectric material layer above the p-doped semiconductor region with an etch mask layer and removing a second portion of the in-process interfacial dielectric material layer from above the n-doped semiconductor region according to an embodiment of the present disclosure.

Referring to FIG. 5, an etch mask layer 317 can be formed over the exemplary structure, which covers the area of the first device region 100 without covering the area of the second device region 200. In one embodiment, the etch mask layer 317 can be a patterned photoresist material layer that is applied over the in-process interfacial dielectric material layer 163 as a blanket layer, and is lithographically patterned by exposure and development such that the developed portion of the photoresist material layer covers the first device region 100 and does not cover the second device region 200.

The first portion of the in-process interfacial dielectric material layer 163 located above the p-doped semiconductor region 53L is covered with the etch mask layer 317. The second portion of the in-process interfacial dielectric material layer 163 located above the n-doped semiconductor region 54L can be removed from above the n-doped semiconductor region 54L by an etch process, which may be an isotropic etch process or an anisotropic etch process. For example, a wet etch process employing dilute hydrofluoric acid can be employed to remove the second portion of the in-process interfacial dielectric material layer 163 while the etch mask layer 317 covers the first portion of the in-process interfacial dielectric material layer 163.

Figure 6:
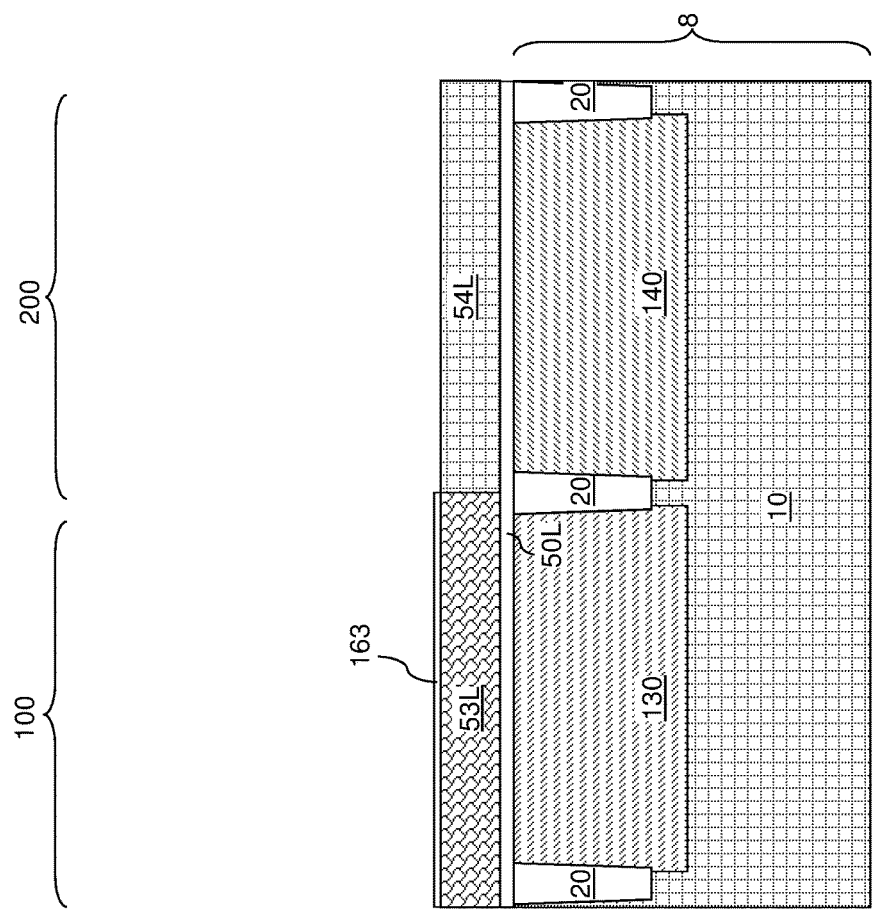
FIG. 6 is a vertical cross-sectional view of the exemplary structure after removal of the etch mask layer according to an embodiment of the present disclosure.

Referring to FIG. 6, the etch mask layer 317 can be removed. For example, if the etch mask layer 317 includes a photoresist layer, the etch mask layer 317 can be removed by ashing.

Figure 7:
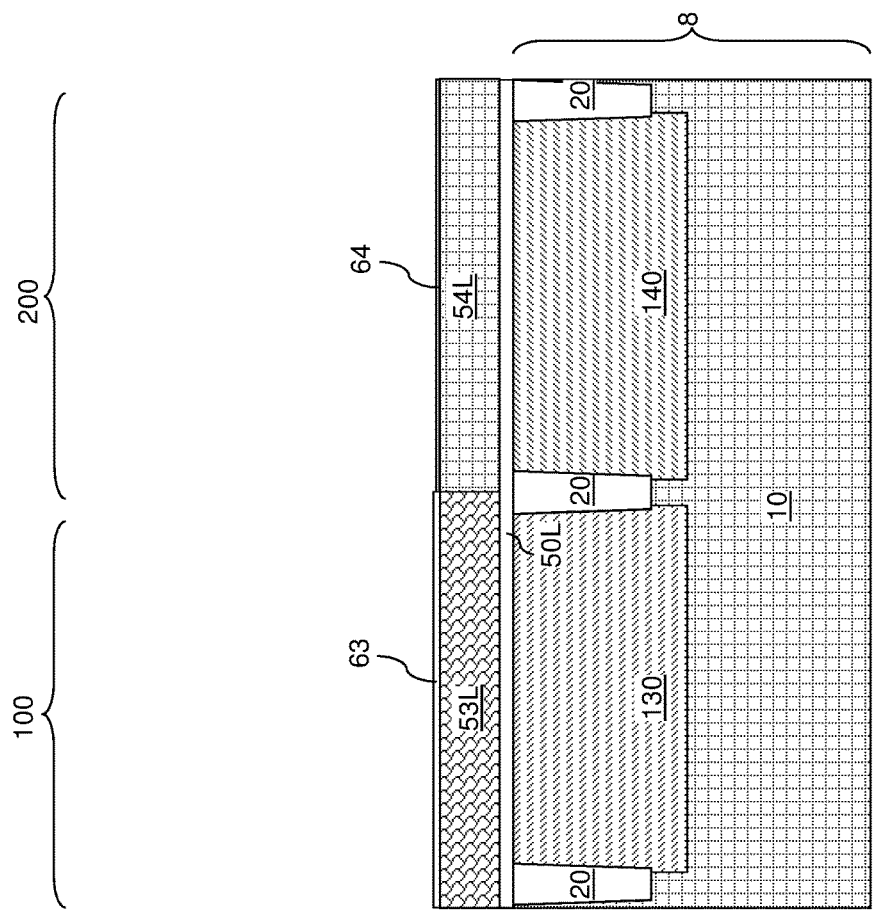
FIG. 7 is a vertical cross-sectional view of the exemplary structure after formation of a first interfacial dielectric layer and a second interfacial dielectric layer by performing a thermal or plasma oxidation process according to an embodiment of the present disclosure.

Referring to FIG. 7, an optional thermal or plasma oxidation process is performed on the remaining portion of the in-process interfacial dielectric material layer 163 and on the physically exposed top surface of the n-doped semiconductor region 54L. A surface portion of the p-doped semiconductor region 53L underlies, and contacts, the first portion of the interfacial dielectric material of the in-process interfacial dielectric material layer 163 prior to the thermal or plasma oxidation process. The surface portion of the p-doped semiconductor region 53L that underlies, and contacts, the first portion of the interfacial dielectric material is converted into a silicon oxide material. A first interfacial dielectric layer 63 is formed on the p-doped semiconductor region 53L. The first interfacial dielectric layer 63 includes a region of the first portion of the interfacial dielectric material (a portion of the in-process interfacial dielectric material layer 163) and a silicon oxide material formed by oxidation of the surface portion of the p-doped semiconductor region 53L that underlies the first portion of the interfacial dielectric material of the in-process interfacial dielectric material layer 163.

A surface portion of the n-doped semiconductor region 54L is physically exposed after removal of the etch mask layer 317 and prior to the thermal or plasma oxidation process. A second interfacial dielectric layer 64 is optionally formed by the optional oxidation of the surface portion of the n-doped semiconductor region 54L during the thermal or plasma oxidation process. The second interfacial dielectric layer 64 is a silicon oxide material layer that is formed concurrently with conversion of the in-process interfacial dielectric material layer 163 into the first interfacial dielectric layer 63 through formation of the additional silicon oxide material. The second interfacial dielectric layer 64 is formed directly on the remaining portion of the n-doped semiconductor region 54L. The first interfacial dielectric layer 63 is thicker than the second interfacial dielectric layer 64. The first interfacial dielectric layer 63 can be 10 to 200 percent thicker, such as 20 to 100 percent thicker than the second interfacial dielectric layer 64

The second interfacial dielectric layer 64 can consist of a silicon oxide material form by oxidation of the surface portion of the n-doped semiconductor region 54L as provided by the thermal or plasma oxidation process. The n-type dopants in the n-doped semiconductor region 54L can be incorporated into the second interfacial dielectric layer 64 with a segregation coefficient greater than 1. In this case, the second interfacial dielectric layer 64 includes n-type dopant atoms at a second atomic n-type dopant concentration that is less than the first atomic n-type dopant concentration in the n-doped semiconductor region 54L.

The thickness of the first and second interfacial dielectric layers (63, 64) can be selected such that leakage current, such as tunneling current, through the first and second interfacial dielectric layers (63, 64) is at a level that renders the first and second interfacial dielectric layers (63, 64) ineffective as an electrically insulating structure. As such, the first interfacial dielectric layer 63 is a surface layer that does not function as a charge trapping structure or a tunneling barrier structure. In one embodiment, the first interfacial dielectric layer 63 can have a thickness that provides leakage of electrical charges thereacross with a time constant less than 1 millisecond. The second interfacial dielectric layer 64 is thinner than the first interfacial dielectric layer 63, and thus, does not function as a charge trapping structure or a tunneling barrier structure, and can provide leakage of electrical charges with a time constant less than 1 millisecond, such as less than 1 microsecond and/or less than 1 nanosecond. In one embodiment, the first interfacial dielectric layer 63 has a first thickness that is in a range from 0.5 nm to 1.5 nm, and the second interfacial dielectric layer 64 has a second thickness that is in a range from 0.3 nm to 0.8 nm.

In one embodiment, the thermal or plasma oxidation process that forms the first interfacial dielectric layer 63 and the second interfacial dielectric layer 64 can be a thermal oxidation process, which may be performed at a temperature in a range from 400 degrees Celsius and 650 degrees Celsius in an oxidizing ambient. The duration of the exposure to an oxidant, such as $H_2O$ or $O_2$, during the respective wet or dry thermal oxidation process can be in a range from 1 second to 600 seconds, although lesser and greater durations can also be employed.

In another embodiment, the thermal or plasma oxidation process that forms the first interfacial dielectric layer 63 and the second interfacial dielectric layer 64 can be a plasma oxidation process. The density, energy, and duration of the plasma during the plasma oxidation process can be selected to provide a target thickness for the second interfacial dielectric layer 64.

Figure 8:
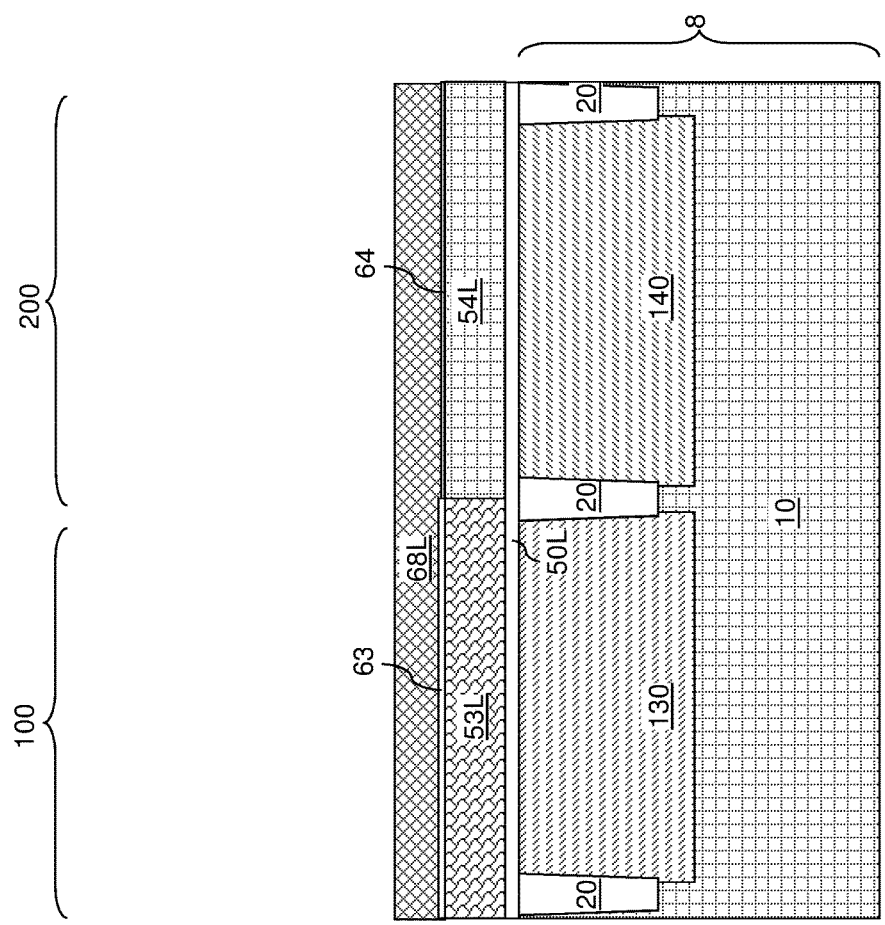
FIG. 8 is a vertical cross-sectional view of the exemplary structure after formation of a metallic gate layer according to an embodiment of the present disclosure.

Referring to FIG. 8, a metallic gate layer over 68L can be formed on the top surfaces of the first interfacial dielectric layer 63 and on the top surface of the second interfacial dielectric layer 64.

The metallic gate layer 68L includes a metallic material such as a metal silicide material, an elemental metal, an intermetallic alloy of at least two elemental metals, a conductive metallic nitride material, or a stack thereof. In one embodiment, the metallic gate layer 68L includes a metal silicide material that is deposited directly on the top surfaces of the first interfacial dielectric layer 63 and directly on the top surface of the second interfacial dielectric layer 64. The metal silicide material can be, for example, nickel silicide, cobalt silicide, tungsten silicide, tantalum silicide, titanium silicide, molybdenum silicide, platinum silicide, or an alloy thereof. The metal silicide material can be deposited by chemical vapor deposition (CVD) or physical vapor deposition (PVD). The thickness of the metal silicide material within the metallic gate layer 68L can be in a range from 30 nm to 300 nm, such as from 60 nm to 150 nm, although lesser and greater thicknesses can also be employed. In one embodiment, the metallic gate layer 68L can consist essentially of the metal silicide material. The composition and the thickness of the metallic gate layer 68L can be the same across the first device region 100 and the second device region 200.

Figure 9:
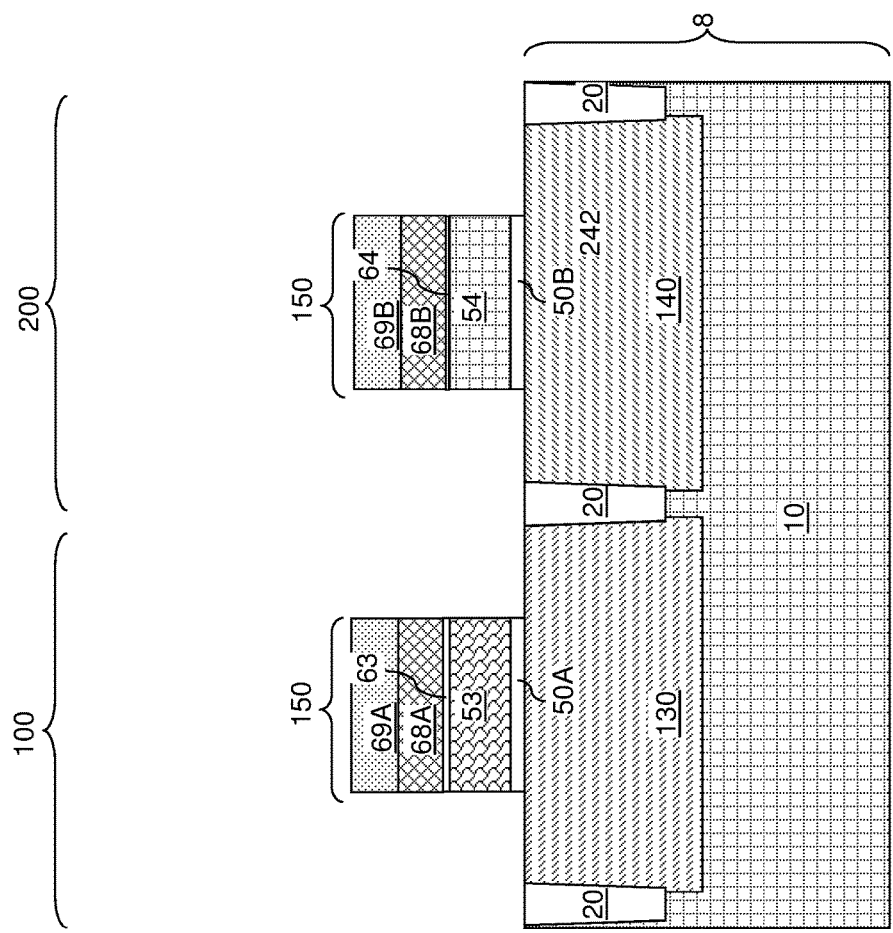
FIG. 9 is a vertical cross-sectional view of the exemplary structure after formation of a first composite gate electrode, a second composite gate electrode, a first gate dielectric, and a second gate dielectric according to an embodiment of the present disclosure.

Referring to FIG. 9, a gate cap dielectric layer can be deposited on the metallic gate layer. The gate cap dielectric layer can include a passivating dielectric material that can prevent diffusion of impurities and hydrogen atoms therethrough. For example, the gate cap dielectric layer can include silicon nitride. The thickness of the gate cap dielectric layer can be in a range from 20 nm to 100 nm, such as from 30 nm to 80 nm, although lesser and greater thicknesses can also be employed.

A photoresist layer (not shown) can be applied over the gate cap dielectric layer, and can be lithographically patterned to cover areas in which gate electrodes are to be subsequently formed. For example, the areas covered by the patterned photoresist layer can include strips that extend across each of the first doped semiconductor well 130 and the second doped semiconductor well 140.

A series of anisotropic etch processes can be performed to etch portions of the gate cap dielectric layer, the metallic gate layer 68L, the first and second interfacial dielectric layers (63, 64), the p-doped semiconductor region 53L, the n-doped semiconductor region 54L, and the continuous gate dielectric layer 50L. Remaining material portions over the substrate 8 in the first device region 100 include a first gate stack 150, and remaining material portions over the substrate 8 in the second device region 200 includes a second gate stack 250. The photoresist layer can be subsequently removed, for example, by ashing.

The first gate stack 150 includes, from bottom to top, a first gate dielectric 50A, a p-doped semiconductor gate electrode 53, a first interfacial dielectric layer 63, a first metallic gate electrode 68A, and a first gate cap dielectric 69A. The first gate dielectric 50A is a patterned portion of the continuous gate dielectric layer 50L. The p-doped semiconductor gate electrode 53 is a patterned portion of the p-doped semiconductor region 53L. The first interfacial dielectric layer 63 is a patterned portion of the first interfacial dielectric layer 63 as provided at the processing steps of FIG. 7. The first metallic gate electrode 68A is a patterned portion of the metallic gate layer 68L. The first gate cap electrode 69A is a patterned portion of the gate cap dielectric layer.

The second gate stack 250 includes, from bottom to top, a second gate dielectric 50B, an n-doped semiconductor gate electrode 54, a second interfacial dielectric layer 64, a second metallic gate electrode 68B, and a second gate cap dielectric 69B. The second gate dielectric 50B is a patterned portion of the continuous gate dielectric layer 50L. The n-doped semiconductor gate electrode 54 is a patterned portion of the n-doped semiconductor region 54L. The second interfacial dielectric layer 64 is a patterned portion of the second interfacial dielectric layer 64 as provided at the processing steps of FIG. 7. The second metallic gate electrode 68B is a patterned portion of the metallic gate layer 68L. The second gate cap electrode 69B is a patterned portion of the gate cap dielectric layer.

The first interfacial dielectric layer 63 has a first thickness, and includes a remaining portion of the first portion of the interfacial dielectric material in the in-process interfacial dielectric material layer 163 and the additional silicon oxide material added to the bottom of the first portion of the interfacial dielectric material during the thermal or plasma oxidation process as generated at the processing steps of FIG. 7. A first vertical stack of the p-doped semiconductor gate electrode 53, the first interfacial dielectric layer 63, and the first metallic gate electrode 68A constitutes a first composite gate electrode (53, 63, 68A).

The second interfacial dielectric layer 64 has a second thickness that is less than the first thickness of the first interfacial dielectric layer 63, contacts the top surface of the n-doped semiconductor gate electrode 54, and contacts the bottom surface of the second metallic gate electrode 68B. A second vertical stack of the n-doped semiconductor gate electrode 54, the second interfacial dielectric layer 64, and the second metallic gate electrode 68B constitutes a second composite gate electrode (54, 64, 68B).

In one embodiment, the p-doped semiconductor gate electrode 53 and the n-doped semiconductor gate electrode 54 can have a substantially same semiconductor gate electrode thickness. As used herein, two gate electrode thicknesses are "substantially same" if the two thicknesses do not differ by more than 10 nm and do not deviate from the average of the two thicknesses by more than 1%. In one embodiment, the first metallic gate electrode 68A and the second metallic gate electrode 68B can have the same material composition and the same metallic gate electrode thickness.

Figure 10:
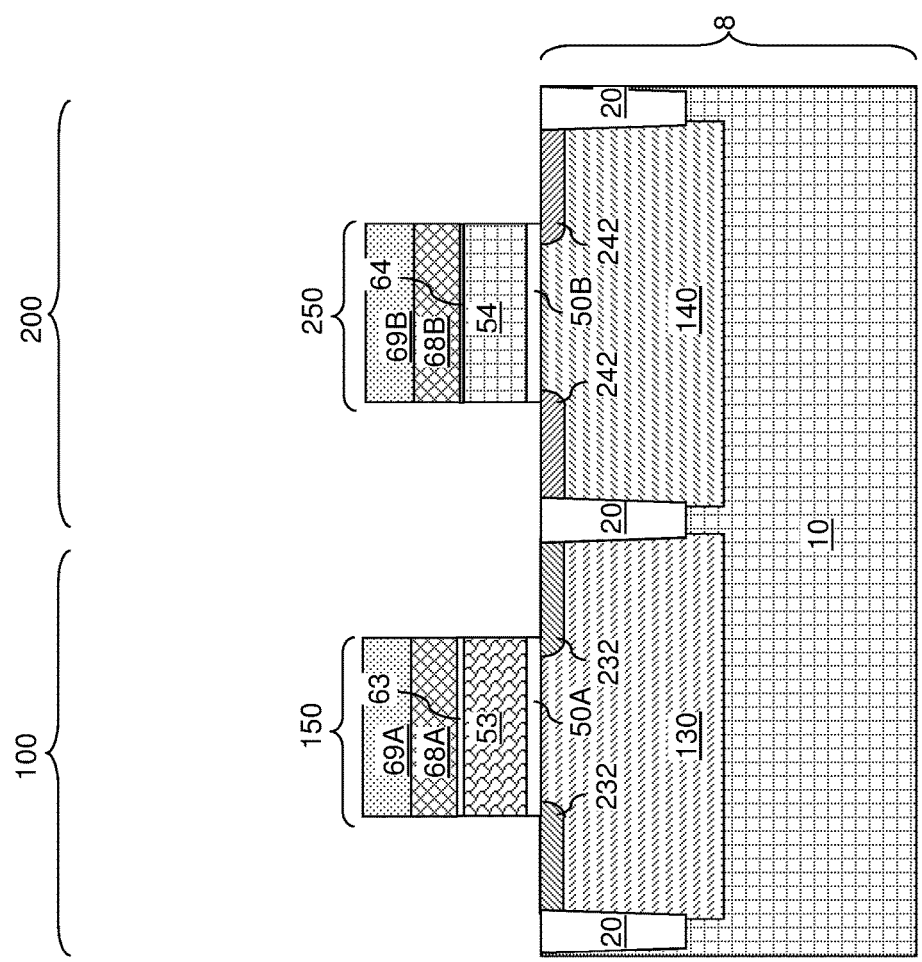
FIG. 10 is a vertical cross-sectional view of the exemplary structure after formation of extension regions according to an embodiment of the present disclosure.

Referring to FIG. 10, extension regions (232, 242), which are also referred to as source and drain extension regions of LDD type source and drain regions, are formed in upper portions of the doped semiconductor wells (130, 140). Each extension region (232, 242) can have a doping of an opposite conductivity type to that of the doped semiconductor well (130, 140) in which the extension region (232, 242) is located. For example, the first doped semiconductor well 130 can have a doping of the first conductivity type (e.g., n-type), and the first extension regions 232 embedded in the first doped semiconductor well 130 can have a doping of the second conductivity type (e.g., p-type). Likewise, the second doped semiconductor well 140 can have a doping of the second conductivity type (e.g., p-type), and the second extension regions 242 embedded in the second doped semiconductor well 140 can have a doping of the first conductivity type (e.g., n-type). In one embodiment, the first conductivity type can be n-type, and the second conductivity type can be p-type. In another embodiment, the first conductivity type can be p-type, and the second conductivity type can be n-type.

The first extension regions 232 can be formed by applying and patterning a first photoresist layer to cover the second device region 200, and by implanting dopants of the second conductivity type into surface portions of the first doped semiconductor well 130 employing the first gate stack 150 and the first photoresist layer as implantation masks. The first photoresist layer is subsequently removed. Likewise, the second extension regions 242 can be formed by applying and patterning a second photoresist layer to cover the first device region 100, and by implanting dopants of the first conductivity type into surface portions of the second doped semiconductor well 140 employing the second gate stack 250 and the second photoresist layer as implantation masks. The second photoresist layer is subsequently removed.

Figure 11:
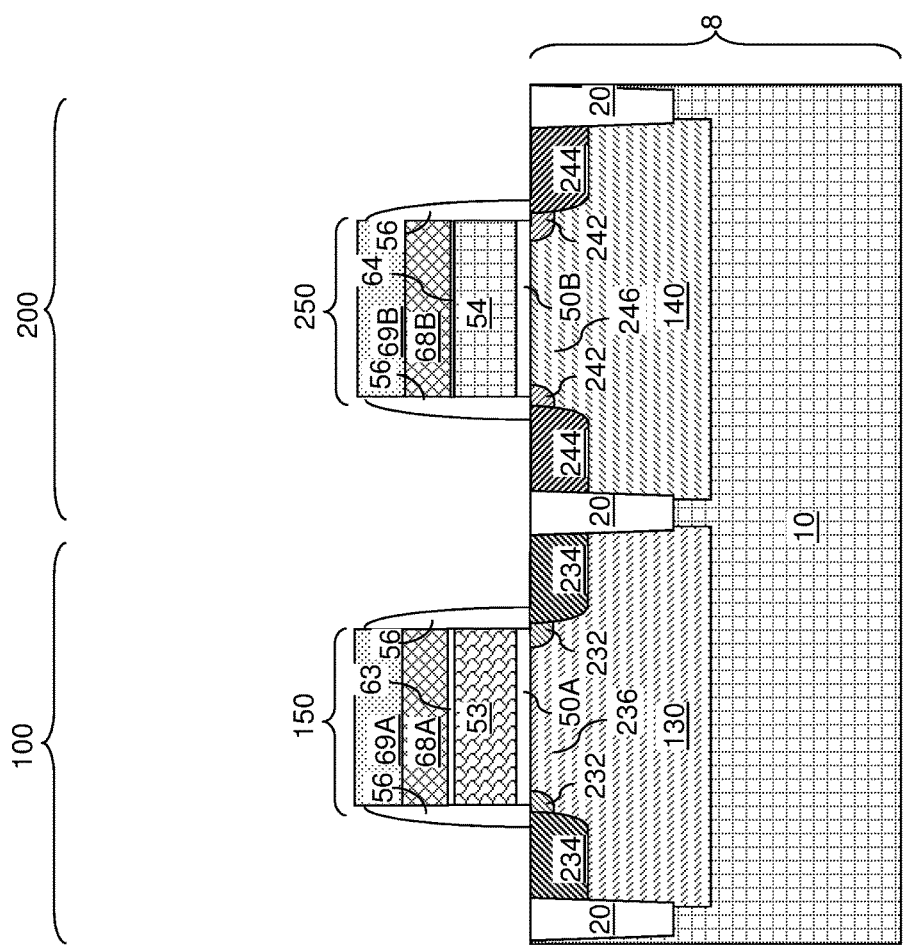
FIG. 11 is a vertical cross-sectional view of the exemplary structure after formation of dielectric gate spacers and source and drain regions according to an embodiment of the present disclosure.

Referring to FIG. 11, at least one spacer dielectric material layer can be deposited over the substrate 8 and the gate stacks (150, 250) by non-conformal deposition process. Each of the at least one spacer dielectric material layer is anisotropically etched to remove horizontal portions. Remaining vertical portions of the at least one spacer dielectric material layer that laterally surround the gate stacks (150, 250) constitute gate dielectric spacers (i.e., gate sidewall spacers) 56. Each gate dielectric spacer 56 includes at least one spacer dielectric material, each of which is a material of the at least one spacer dielectric material layer. Each gate dielectric spacer 56 can consist of a single spacer dielectric material derived from a single spacer dielectric material layer, or can include multiple spacer dielectric materials derived from multiple spacer dielectric material layers. Exemplary materials that can be employed for the gate dielectric spacers 56 include silicon oxide, silicon nitride, silicon oxynitride, and dielectric metal oxides. In one embodiment, the gate dielectric spacers 56 can include silicon oxide and/or silicon nitride. Each gate dielectric spacer 56 laterally surrounds, and contacts, a gate stack (150 or 250). The lateral thickness of each gate dielectric spacer 56, as measured at the base of each gate dielectric spacer 56 that contacts the top surface of the substrate 8, can be in a range from 10 nm to 100 nm, although lesser and greater lateral thicknesses can also be employed. The lateral thickness of the gate dielectric spacers 56 can be determined based on the target offset distance between areas of the extension regions (232, 242) and active region (234, 244) to be subsequently formed.

Active region (234, 244), which are also referred to as source and drain regions, are formed in upper portions of the doped semiconductor wells (130, 140) with a greater depth than the extension regions (232, 242). Each active region (234, 244) can have a doping of the same conductivity type as a respective overlapping extension region (232, 242). For example, the first doped semiconductor well 130 can have a doping of the first conductivity type, and the first extension regions 232 and the first active regions 234 embedded in the first doped semiconductor well 130 can have a doping of the second conductivity type. Likewise, the second doped semiconductor well 140 can have a doping of the second conductivity type, and the second extension regions 242 and the second active regions 244 embedded in the second doped semiconductor well 140 can have a doping of the first conductivity type. In one embodiment, the first conductivity type can be n-type, and the second conductivity type can be p-type. In another embodiment, the first conductivity type can be p-type, and the second conductivity type can be n-type.

The first active regions 234 can be formed by applying and patterning a third photoresist layer to cover the second device region 200, and by implanting dopants of the second conductivity type into surface portions of the first doped semiconductor well 130 employing the first gate stack 150, the gate dielectric spacers 56 in the first device region 100, and the third photoresist layer as implantation masks. The third photoresist layer is subsequently removed. Likewise, the second active regions 244 can be formed by applying and patterning a fourth photoresist layer to cover the second device region 200, and by implanting dopants of the first conductivity type into surface portions of the second doped semiconductor well 140 employing the second gate stack 250, the gate dielectric spacers 56 in the second device region 200, and the fourth photoresist layer as implantation masks. The fourth photoresist layer is subsequently removed. The active regions (234, 244) can have higher dopant concentrations than the extension regions (232, 242). Respective semiconductor channels (236, 246) are located between the respective active regions (234, 244).

Figure 12:
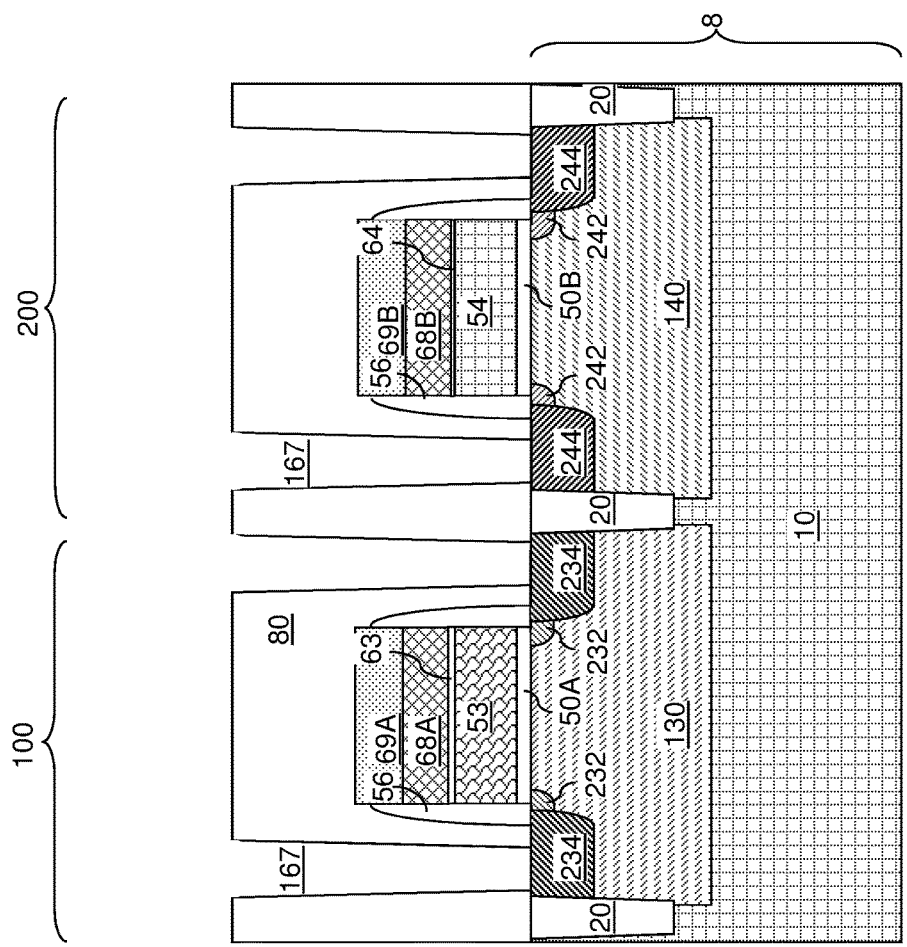
FIG. 12 is a vertical cross-sectional view of the exemplary structure after formation of a planarization dielectric layer and source and drain contact via cavities according to an embodiment of the present disclosure.

Referring to FIG. 12, a diffusion barrier dielectric layer (not shown) and/or at least one stress-generating dielectric layer (not shown) can be optionally formed over the gate stacks (150, 250) and the substrate 8. A contact level dielectric layer 80 can be formed over the gate stacks (150, 250) and the substrate 8. In one embodiment, the contact level dielectric layer 80 includes a planarizable dielectric material or a self-planarizing dielectric material. For example, the contact level dielectric layer 80 can include undoped silicate glass, doped silicate glass, organosilicate glass, or spin-on glass. The contact level dielectric layer 80 can be formed by chemical vapor deposition (CVD) or spin coating. If the contact level dielectric layer 80 does not include a self-planarizing material (such as a spin-on glass), the top surface of the contact level dielectric layer 80 can be planarized by chemical mechanical planarization process to provide a planar top surface.

A photoresist layer (not shown) can be applied over the contact level dielectric layer 80, and can be lithographically patterned to form openings within areas that overlie the active regions (234, 244). An anisotropic etch process can be performed employing the photoresist layer as an etch mask. Unmasked portions of the contact level dielectric layer 80 (and any other dielectric material layer overlying the substrate 8, if present) can be etched by the anisotropic etch process. Cavities, which are herein referred to as active region contact via cavities 167, are formed through the contact level dielectric layer 80. A top surface of a respective one of the active regions (234, 244) can be physically exposed at the bottom of each active region contact via cavity 167.

Figure 13:
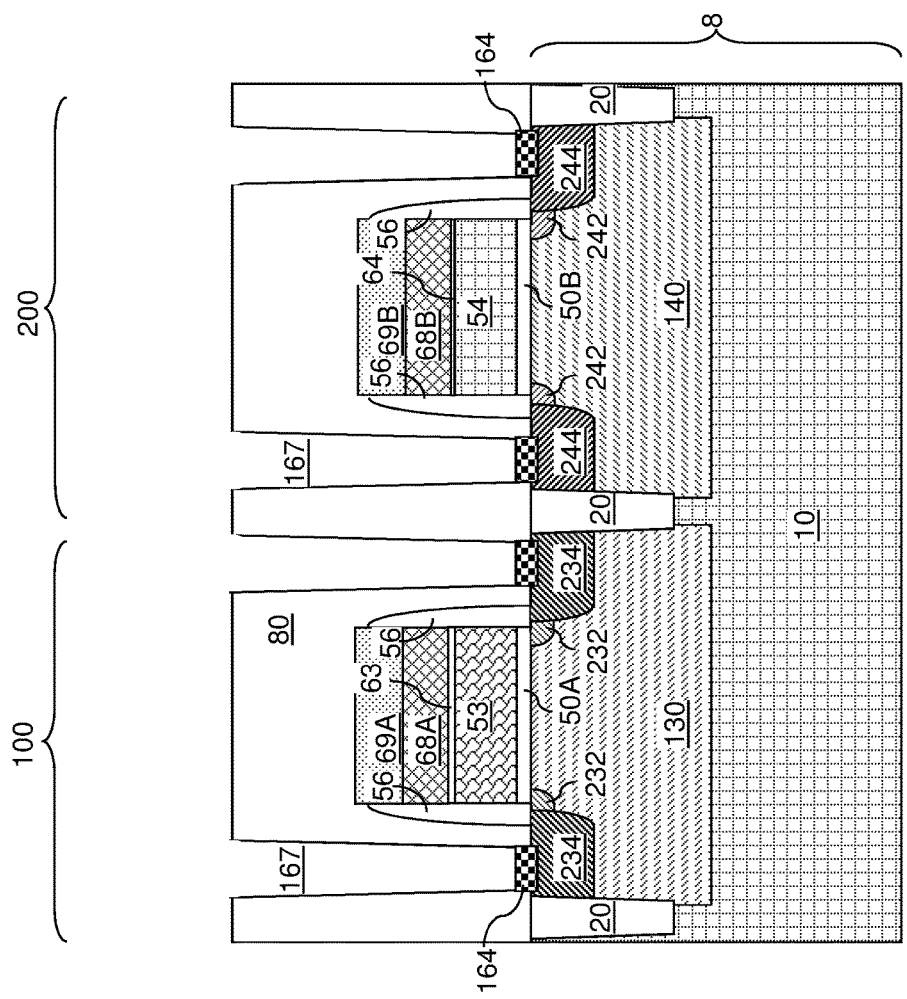
FIG. 13 is a vertical cross-sectional view of the exemplary structure after formation of source and drain metal silicide regions according to an embodiment of the present disclosure.

Referring to FIG. 13, metal can be optionally deposited at the bottom of each active region contact via cavity 167, for example, by physical vapor deposition (PVD). An anneal process can be performed at an elevated temperature to induce a silicidation reaction between the deposited metal and surface portions of the active regions (234, 244). Reacted portions of the metal and the semiconductor material from the active regions (234, 244) form active region metal silicide portions 164. Unreacted portions of the metal in the active region contact via cavities 167 and over the contact level dielectric layer 80 can be removed by a wet etch process that removes the metal selective to the metal silicide material of the active region metal silicide portions 164.

Figure 14:
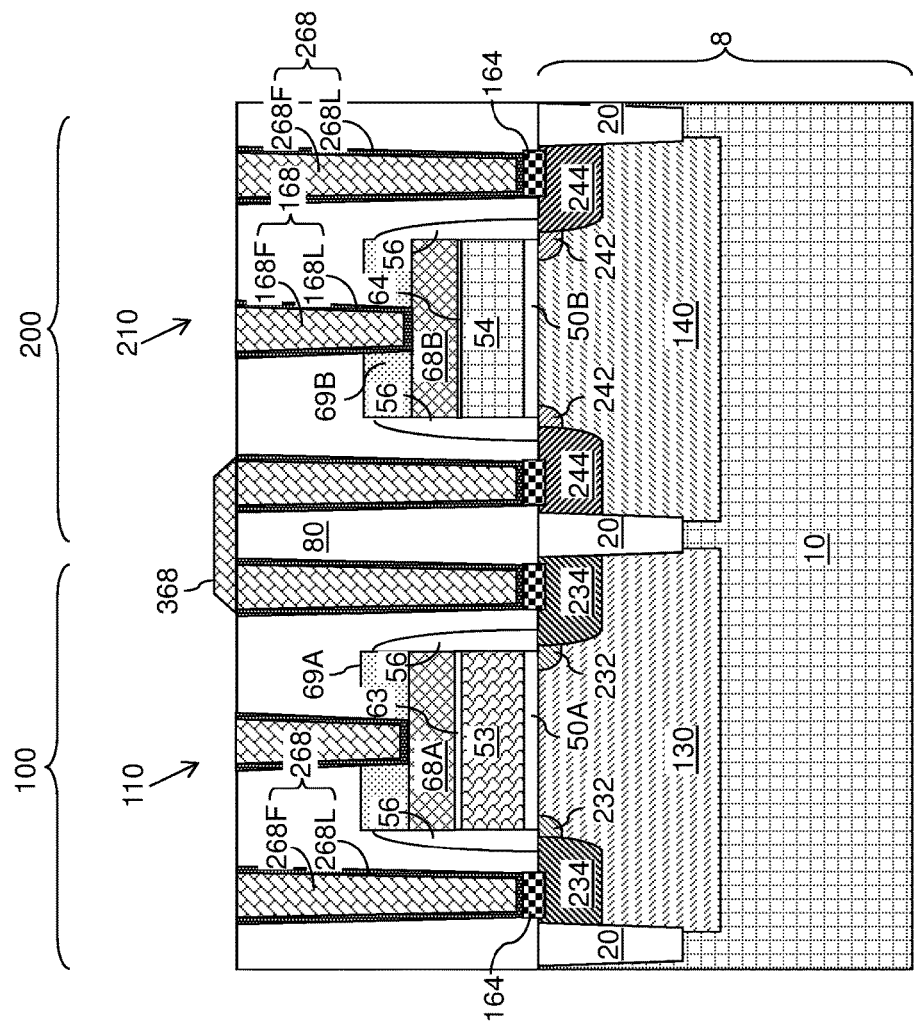
FIG. 14 is a vertical cross-sectional view of the exemplary structure after formation of contact via structures according to an embodiment of the present disclosure.

Referring to FIG. 14, additional contact via cavities, which are herein referred to gate contact via cavities, can be formed through the contact level dielectric layer 80 and the gate cap dielectrics (69A, 69B). For example, a photoresist layer can be applied over the contact level dielectric layer 80, and can be lithographically patterned to form openings that overlie the composite gate electrodes (53, 63, 68A) and (54, 64, 68B). Unmasked portions of the contact level dielectric layer 80 and the gate cap dielectrics (69A, 69B) can be etched by an anisotropic etch process that employs the photoresist layer as an etch mask. A top surface of a metallic gate electrode (68A, 68B) can be physically exposed at the bottom of each gate contact via cavity. The photoresist layer can be subsequently removed, for example, by ashing.

At least one conductive material can be deposited in the active region contact via cavities and gate contact via cavities to form contact via structures (168, 268). For example, a metallic liner layer and a metal fill material layer can be sequentially deposited in the active region contact via cavities and the gate contact via cavities. Excess portions of the metallic liner layer and the metal fill material layer can be removed from above the horizontal plane including the top surface of the contact level dielectric layer 80 by a planarization process, which can include a recess etch process and/or a chemical mechanical planarization process. Each active region contact via cavity is filled with an active region contact via structure 268, which includes an active region contact metallic nitride liner 268L and an active region contact metal fill portion 268F. Each gate contact via cavity is filled with a gate contact via structure 168, which includes a gate contact metallic nitride liner 168L and a gate contact metal fill portion 168F.

In one embodiment, a first gate contact via structure 168 can be formed on the first metallic gate electrode 68A, and a second gate contact via structure 168 can be formed on the second metallic gate electrode 68B. The p-doped semiconductor gate electrode 53 can be in direct contact with the first gate dielectric 50A, and the n-doped semiconductor gate electrode 54 can be in direct contact with the second gate dielectric 50B. The first metallic gate electrode 68A and the second metallic gate electrode 68B can consist essentially of a metal silicide.

A PMOS transistor 110 is formed in region 100 and an NMOS transistor 210 is formed in region 200. In one embodiment the active region (e.g., source or drain) 234 of the PMOS transistor 110 and the active region (e.g., drain or source) of the 244 NMOS transistor 210 are electrically connected via an interconnect or strap 368. In this case, the PMOS transistor 110 and the NMOS transistor 210 form a CMOS device.

Various thermal processing steps that follow formation of the metallic gate layer at the processing steps of FIG. 8 can degrade electrical contact between the p-doped semiconductor gate electrode 53 and the first metallic gate electrode 68A and electrical contact between the n-doped semiconductor gate electrode 54 and the second metallic gate electrode 68B. The mechanism for such degradation of electrical contact include diffusion of p-type dopants and n-type dopants into the first and second metallic gate electrodes (68A, 68B) as well as formation of interdiffusion regions in which high resistance compounds of the metal and silicon, such as metal silicide materials having high resistivity, at the interface between the p-doped semiconductor gate electrode 53 and the first metallic gate electrode 68A and electrical contact between the n-doped semiconductor gate electrode 54 and the second metallic gate electrode 68B. The degree of diffusion and formation of high-resistance compounds is different between the interface of the p-doped semiconductor gate electrode 53 and the first metallic gate electrode 68A and the interface of the n-doped semiconductor gate electrode 54 and the second metallic gate electrode 68B. Specifically, the interface of the p-doped semiconductor gate electrode 53 and the first metallic gate electrode 68A generates more diffusion of materials due to the diffusive property of p-type dopants such as boron atoms than the interface of the n-doped semiconductor gate electrode 54 and the second metallic gate electrode 68B.

According to an aspect of the present disclosure, the first interfacial dielectric layer 63 having the first thickness and the second interfacial dielectric layer 64 having the second thickness which is less than the first thickness provide optimal levels of diffusion suppression at the respective interfaces between an underlying doped semiconductor gate electrode (53, 54) and an overlying metallic gate electrode (68A, 68B) that are adjusted for the different diffusion characteristics of the p-type dopants and n-type dopants. Specifically, diffusion of the p-type dopants is suppressed more than diffusion of n-type dopants. The thicknesses of the first interfacial dielectric layer 63 and the second interfacial dielectric layer 64 are selected such that leakage current, such as tunneling current, through the first interfacial dielectric layer 63 or the second interfacial dielectric layer 64 is sufficiently high, and is at a level that renders the first interfacial dielectric layer 63 and the second interfacial dielectric layer 64 ineffective as an electrically insulating structure. As such, the first interfacial dielectric layer 63 and the second interfacial dielectric layer 64 are surface layers that do not function as charge trapping structures or tunneling barrier structures. In one embodiment, the first thickness is in a range from 0.5 nm to 1.5 nm, and the second thickness is in a range from 0.3 nm to 0.8 nm. In one embodiment, an interfacial resistance between the p-doped semiconductor gate electrode 53 and the first metallic gate electrode 68A is less than $1.0 \times 10^4$ Ohm-micron$^2$, and an interfacial resistance between the n-doped semiconductor gate electrode 54 and the second metallic gate electrode 68B is less than the interfacial resistance between the p-doped semiconductor gate electrode 53 and the first metallic gate electrode 68A.

Figure 15:
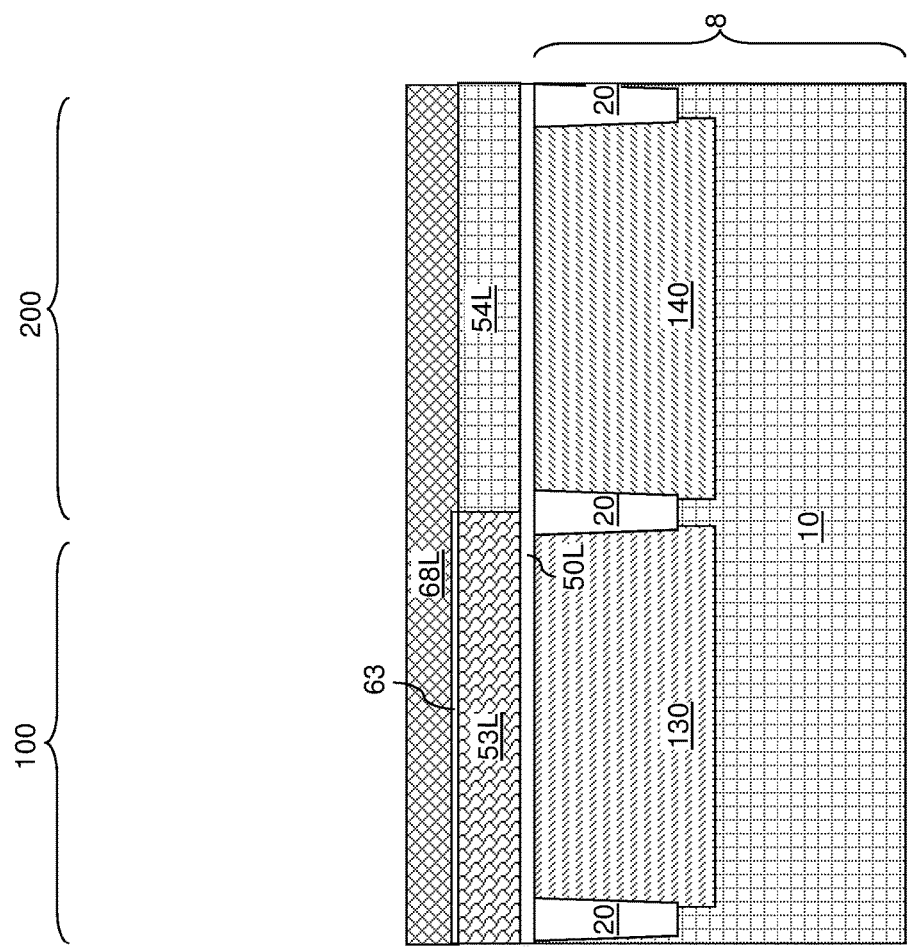
FIG. 15 is an alternative embodiment of the exemplary structure that is derived by omitting the processing steps of FIG. 7 according to an embodiment of the present disclosure.

Referring to FIG. 15, an alternative embodiment of the exemplary structure can be derived from the exemplary structure of FIG. 6 by omitting the processing steps of FIG. 7, and by performing the processing steps of FIG. 8 on the exemplary structure of FIG. 6. Thus, the thermal or plasma oxidation process that forms the second interfacial dielectric layer 64 is omitted, and the metallic gate layer 68L is formed directly on the top surfaces of the first interfacial dielectric layer 63 and directly on the top surface of the n-doped semiconductor region 54L.

In this case, the first interfacial dielectric layer 63 provided in the first device region 100 can be the same as the remaining portion of the in-process interfacial dielectric material layer 163 as provided after the processing steps of FIG. 6. The first interfacial dielectric layer 63 consists of a region of the first portion of the interfacial dielectric material as derived from the in-process interfacial dielectric material layer 163.

The thickness of the first interfacial dielectric layer 63 (which is the same as the thickness of the in-process interfacial dielectric material layer 163) can be selected such that leakage current, such as tunneling current, through the first interfacial dielectric layer 63 is at a level that renders the first interfacial dielectric layer 63 ineffective as an electrically insulating structure. As such, the first interfacial dielectric layer 63 is a surface layer that does not function as a charge trapping structure or a tunneling barrier structure. In one embodiment, the first interfacial dielectric layer 63 can have a thickness that provides leakage of electrical charges thereacross with a time constant less than 1 millisecond. The second interfacial dielectric layer 64 is omitted and the underlying doped semiconductor gate electrode 54 directly physically contacts the overlying metallic gate electrode 68B in the NMOS transistor in region 200.

Figure 16:
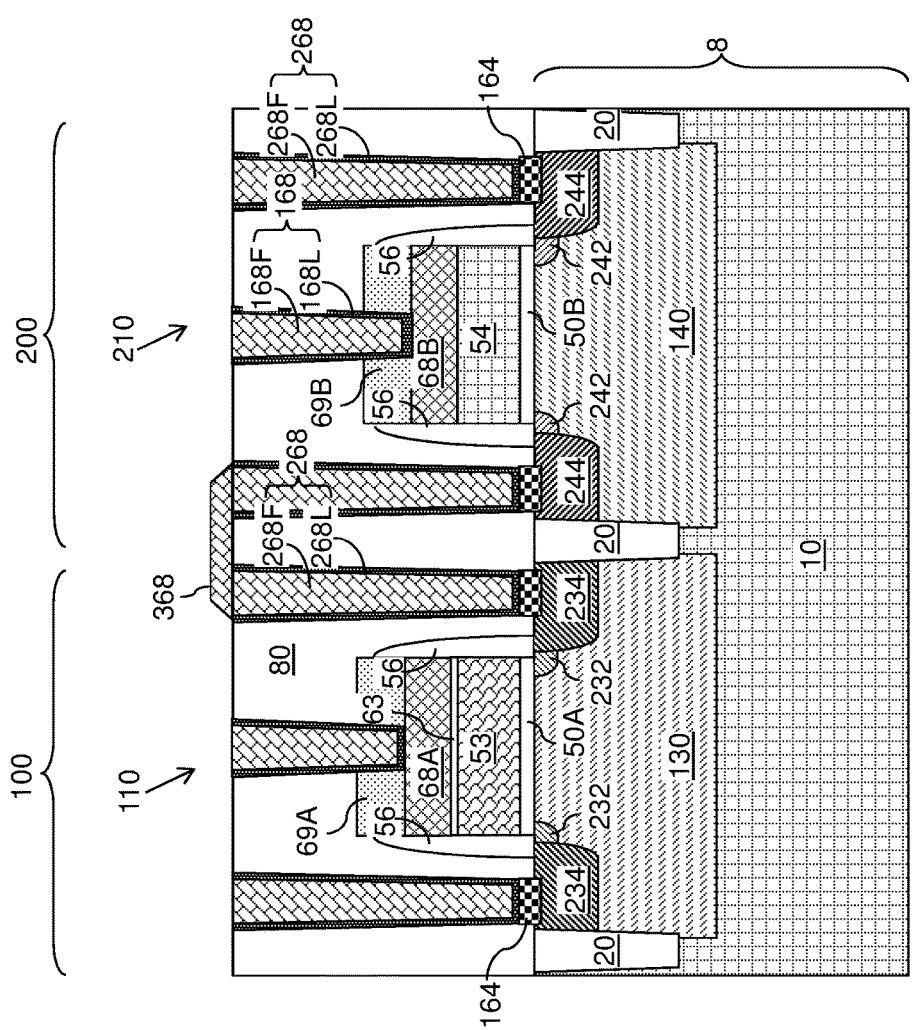
FIG. 16 is the alternative embodiment of the exemplary structure after formation of contact via structures according to an embodiment of the present disclosure.

Referring to FIG. 16, the processing steps of FIGS. 9-14 can be sequentially formed to provide a first composite gate electrode (53, 63, 68A) and a second composite gate electrode (54, 68B), various extension regions (232, 242), dielectric gate spacers 56, various active regions (234, 244), a contact level dielectric layer 80, and various contact via structures (168, 268). The second composite gate electrode (54, 68B) can consist of an n-doped semiconductor gate electrode 54 and a second metallic gate electrode 68B having a bottom surface that contacts a top surface of the n-doped semiconductor gate electrode 54. Thus, the interface region between the n-doped semiconductor gate electrode 54 and the second metallic gate electrode 68B has a configuration of a direct contact between the n-doped semiconductor gate electrode 54 and the second metallic gate electrode 68B. The first metallic gate electrode 68A and the second metallic gate electrode 68B can consist essentially of a metal silicide.

In one embodiment, the thickness of the first interfacial dielectric layer 63 can be in a range from 0 nm to 1.5 nm, such as either 0 nm or 0.5 nm to 1.5 nm. In one embodiment, an interfacial resistance between the p-doped semiconductor gate electrode 53 and the first metallic gate electrode 68A is less than $1.0 \times 10^4$ Ohm-micron$^2$, and an interfacial resistance between the n-doped semiconductor gate electrode 54 and the second metallic gate electrode 68B is less than the interfacial resistance between the p-doped semiconductor gate electrode 53 and the first metallic gate electrode 68A.

Figure 17:
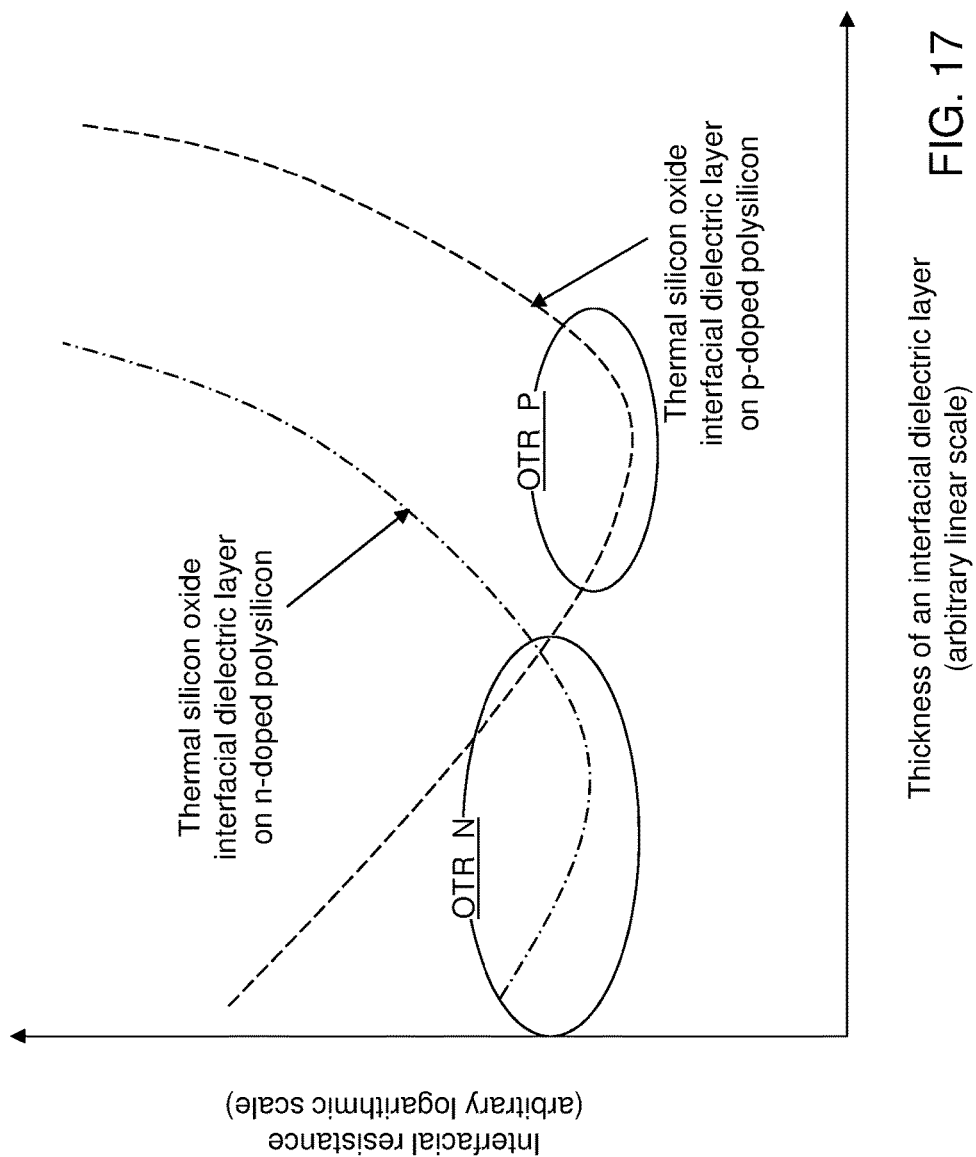
FIG. 17 is a graph schematically illustrating dependence of interfacial resistance on the thickness of an interfacial dielectric layer according to an embodiment of the present disclosure.

The present inventors recognized that the interfacial resistance between a p-doped semiconductor gate electrode and a first metallic gate electrode with a first intervening interfacial dielectric layer has a different characteristic as a function of the thickness of the first intervening interfacial dielectric layer than the interfacial resistance between an n-doped semiconductor gate electrode and a second metallic gate electrode with a second intervening interfacial dielectric layer as a function of the thickness of the second intervening interfacial dielectric layer. The difference in the characteristics of the interfacial resistance is schematically illustrated in FIG. 17. The optimal thickness region for the interfacial resistance between a p-doped semiconductor gate electrode and a first metallic gate electrode with a first intervening interfacial dielectric layer is marked as "OTR_P" in FIG. 17. The optimal thickness region for the interfacial resistance between an n-doped semiconductor gate electrode and a second metallic gate electrode with a second intervening interfacial dielectric layer is marked as "OTR_N" in FIG. 17.

According to an aspect of the present disclosure, the different thickness ranges for OTR_P and the OTR_N can be accommodated by a first configuration that employs a pair of a first interfacial dielectric layer 63 having a first thickness in a first device region 100 and a second interfacial dielectric layer 64 having a smaller second thickness in a second device region 200. Alternatively, the different thickness ranges for OTR_P and OTR_N can be accommodated by a second configuration that employs a first interfacial dielectric layer 63 having a first thickness in a first device region 100 and no interfacial dielectric layer in a second device region 200.

Figure 18:
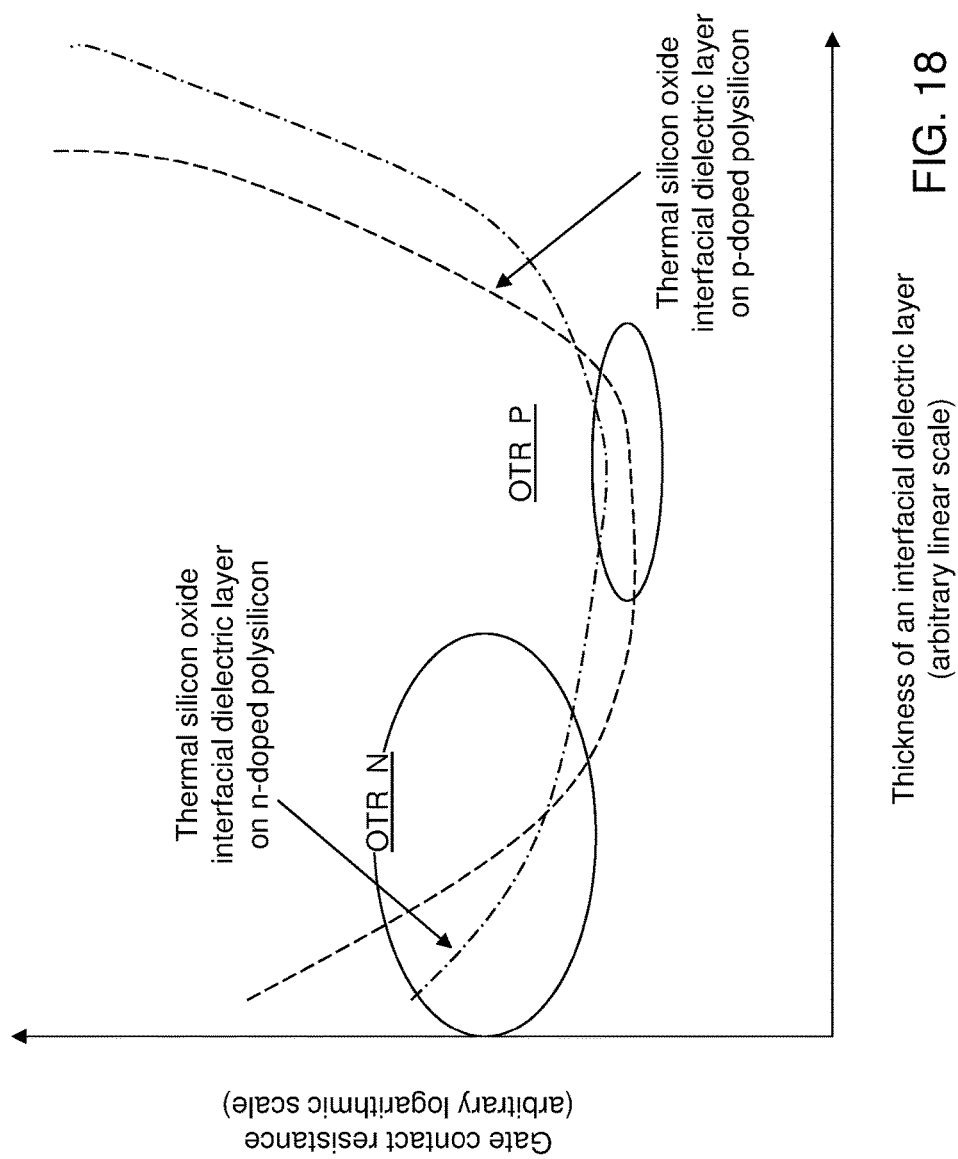
FIG. 18 is a graph schematically illustrating dependence of gate contact resistance on the thickness of an interfacial dielectric layer according to an embodiment of the present disclosure.
Figure 19:
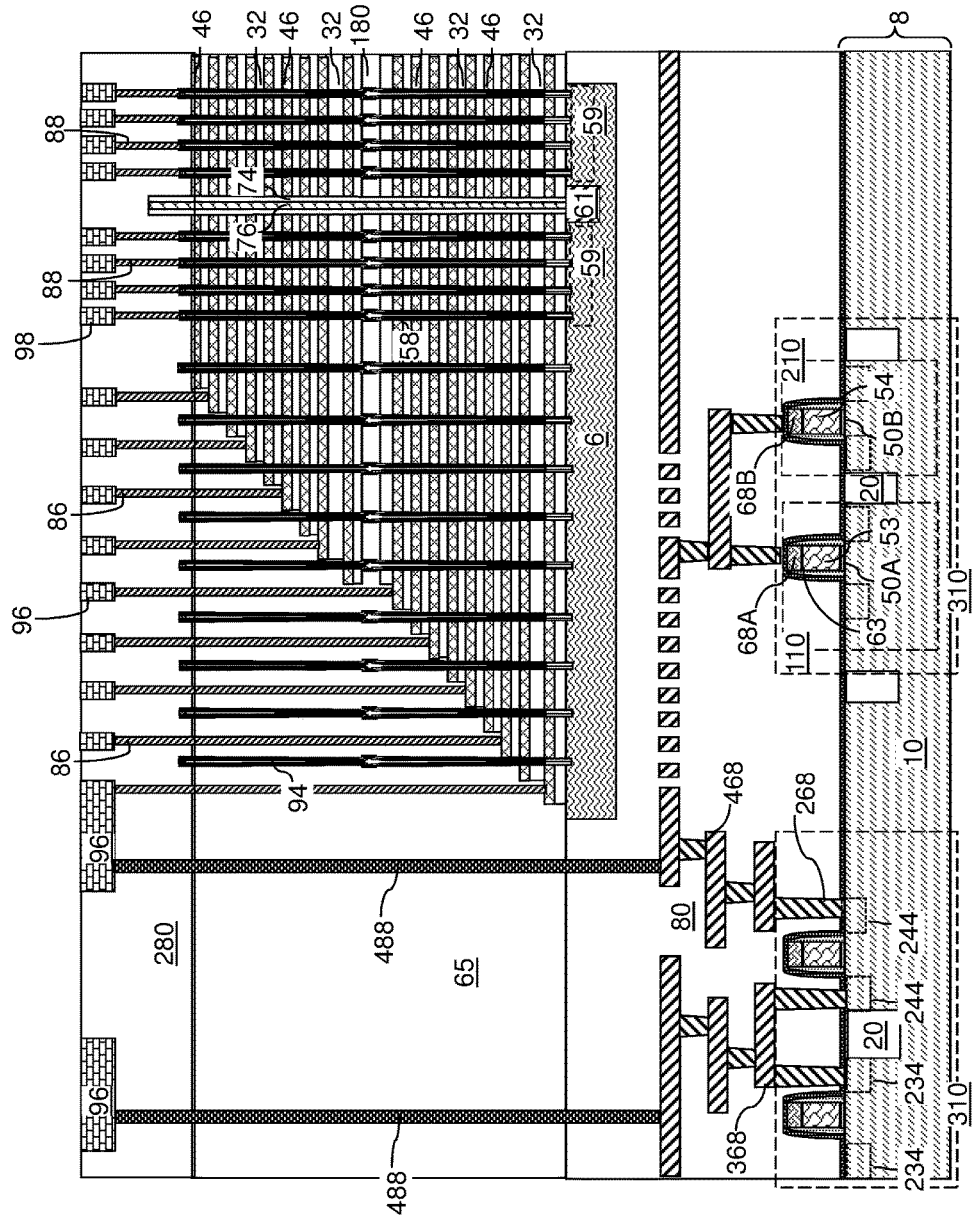
FIG. 19 is a vertical cross-sectional view of a memory device according to an embodiment of the present disclosure.

The present inventors also recognized that selection of different thickness ranges for an interfacial dielectric layer is not detrimental for operation of semiconductor devices. FIG. 18 is a graph schematically illustrating dependence of gate contact resistance on the thickness of an interfacial dielectric layer. The thickness ranges for OTR_N provides an acceptable level of gate contact resistance. Through reduction of the interfacial resistance as illustrated in FIG. 17, the combination of the first composite gate electrode (53, 63, 68A) and the second composite gate electrode {(54, 64, 68B) or (54, 68B)} of the present disclosure can provide superior performance for CMOS devices than conventional devices. In an exemplary application, the first composite gate electrode (53, 63, 68A) can be employed for p-type field effect transistors, and the second composite gate electrode {(54, 64, 68B) or (54, 68B)} can be employed for n-type field effect transistors, although other applications are also possible.

The p-type field effect transistor (i.e., PMOS) 110 and the n-type field effect transistors 210 can be part of the CMOS device 310 that functions as part of the driver (i.e., peripheral) circuitry for a memory device. The memory device may be located over the CMOS device 310 or on the substrate 8 to the side of the CMOS device 310. The memory device may be a three dimensional vertical NAND memory device containing an alternating stack of insulating layers 32 and electrically conductive layers 46 which include word lines and select gate electrodes. The memory device also includes memory stack structures 58 extending through the alternating stack (32, 46). The memory stack structures 58 include a memory film, a vertical semiconductor channel and a drain region. The memory film may include a blocking dielectric, charge storage regions (e.g., a silicon nitride charge storage layer or vertically separated floating gates) and a blocking dielectric. The vertical semiconductor channels are electrically connected to a horizontal semiconductor channel 59 located in a semiconductor layer 6. A source region 61 is located in the semiconductor layer 6. A source electrode or local interconnect 76 extends through the alternating stack and is surrounded by a dielectric spacer 74. An interlayer dielectric 180 may be located between the alternating stacks in a multi-tier device. Word lines contact via structures 86 extend through a dielectric fill 65 and a contact level dielectric 280 to contact respective word lines 46 in a stepped contact region. Support pillars 94 extend through the alternating stack (32, 46) in the stepped contact region. Drain contact via structures 88 extend through the contact level dielectric 280 electrically connect the drain regions to the bit lines 98. Local interconnects 96, peripheral contact via structures 488 and peripheral interconnects 468 interconnect the word lines 46 to the CMOS devices 310 of the driver circuit.

According to various aspects of the present disclosure, a semiconductor structure comprises a first field effect transistor 110 and a second field effect transistor 210. The first field effect transistor 110 comprises a first source region 234, a first drain region 234, a first channel region 236 located between the first source region and the first drain region, a first gate dielectric 50A and a first composite gate electrode comprising a first vertical stack 150 of a p-doped semiconductor gate electrode 53, a first interfacial dielectric layer 63 having a first thickness, and a first metallic gate electrode 68A. The second field effect transistor 210 comprises a second source region 244, a second drain region 244, a second channel region 246 located between the second source region and the second drain region, a second gate dielectric 50B, and a second composite gate electrode comprising a second vertical stack 250 comprising an n-doped semiconductor gate electrode 54 and a second metallic gate electrode 68B. In one embodiment, no interfacial dielectric layer located in an interfacial region between the n-doped semiconductor gate electrode 54 and the second metallic gate electrode 68B. In another embodiment, a second interfacial dielectric layer 64 having a second thickness that is less than the first thickness located in the interfacial region between the n-doped semiconductor gate electrode 54 and the second metallic gate electrode 68B.

Therefore, an interfacial region between the n-doped semiconductor gate electrode 54 and the second metallic gate electrode 68B has a configuration selected from a first configuration in which a second interfacial dielectric layer 64 having a second thickness that is less than the first thickness contacts a surface of the n-doped semiconductor gate electrode 54 and a surface of the second metallic gate electrode 68B, and a second configuration in which a surface of the n-doped semiconductor gate electrode 54 contacts a surface of the second metallic gate electrode 68B.

In one embodiment, the first interfacial dielectric layer 63 has a thickness that provides leakage of electrical charges thereacross with a time constant less than 1 millisecond, i.e., is unsuitable as a charge trapping structure or as a charge blocking structure. The p-doped semiconductor gate electrode 53 can include boron-doped polysilicon, and the n-doped semiconductor gate electrode 54 can include n-doped polysilicon. The interfacial layers (63, 64) can comprise silicon oxide. In one embodiment, the p-doped semiconductor gate electrode 53 includes boron atoms at a first atomic boron concentration, and the first interfacial dielectric layer 63 includes boron atoms at a second atomic boron concentration that is the same as, or greater than, the first atomic boron concentration.

In one embodiment, the interfacial region between the n-doped semiconductor gate electrode 54 and the second metallic gate electrode 68B has the first configuration. The n-doped semiconductor gate electrode 54 includes n-type dopant atoms at a first atomic n-type dopant concentration, and the second interfacial dielectric layer 64 includes the n-type dopant atoms at a second atomic n-type dopant concentration that is less than the first atomic n-type dopant concentration. In one embodiment, the first thickness is in a range from 0.5 nm to 1.5 nm, and the second thickness is in a range from 0.3 nm to 0.8 nm.

In one embodiment, the interfacial region between the n-doped semiconductor gate electrode 54 and the second metallic gate electrode 68B has the second configuration. In one embodiment, the p-doped semiconductor gate electrode 53 and the n-doped semiconductor gate electrode 54 have a substantially same semiconductor gate electrode thickness, and the first metallic gate electrode 68A and the second metallic gate electrode 68B have a same material composition and a same metallic gate electrode thickness. In one embodiment, the first metallic gate electrode 68A and the second metallic gate electrode 68B consist essentially of a metal silicide. In one embodiment, an interfacial resistance between the p-doped semiconductor gate electrode 53 and the first metallic gate electrode 68A is less than $1.0 \times 10^4$ Ohm-micron$^2$.

In one embodiment, the first field effect transistor 110 comprises a PMOS transistor of a CMOS 310 and the second field effect transistor 210 comprises a NMOS transistor of the same CMOS 310. In one embodiment, the CMOS 310 comprises part of a driver circuit of a three dimensional vertical NAND memory device which is located over the CMOS 310.

In one embodiment, the semiconductor structure can include a first gate contact via structure 168 in direct contact with the first metallic gate electrode 68A, and a second gate contact via structure 168 in direct contact with the second metallic gate electrode 68B. The p-doped semiconductor gate electrode 53 can be in direct contact with the first gate dielectric 50A, and the n-doped semiconductor gate electrode 54 can be in direct contact with the second gate dielectric 50B.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

The invention claimed is:
1. A semiconductor structure comprising:
a first field effect transistor; and
a second field effect transistor,
wherein the first field effect transistor comprises:
  a first source region;
  a first drain region;
  a first channel region located between the first source region and the first drain region;
  a first gate dielectric; and
  a first composite gate electrode comprising a first vertical stack of a p-doped semiconductor gate electrode, a first interfacial dielectric layer having a first thickness, and a first metallic gate electrode;
wherein the second field effect transistor comprises:
  a second source region;
  a second drain region;
  a second channel region located between the second source region and the second drain region;
  a second gate dielectric; and
  a second composite gate electrode comprising a second vertical stack comprising an n-doped semiconductor gate electrode and a second metallic gate electrode, and either no interfacial dielectric layer located in an interfacial region between the n-doped semiconductor gate electrode and the second metallic gate electrode, or a second interfacial dielectric layer having a second thickness that is less than the first thickness is located in the interfacial region between the n-doped semiconductor gate electrode and the second metallic gate electrode.

2. The semiconductor structure of claim 1, wherein the second composite gate electrode comprises the second vertical stack comprising the second interfacial dielectric layer having the second thickness that is less than the first thickness located in the interfacial region between the n-doped semiconductor gate electrode and the second metallic gate electrode.

3. The semiconductor structure of claim 2, wherein:
the first thickness is in a range from 0.5 nm to 1.5 nm; and
the second thickness is in a range from 0.3 nm to 0.8 nm.

4. The semiconductor structure of claim 1, wherein the second composite gate electrode comprises the second vertical stack comprising the n-doped semiconductor gate electrode and the second metallic gate electrode, and no interfacial dielectric layer is located in the interfacial region between the n-doped semiconductor gate electrode and the second metallic gate electrode.

5. The semiconductor structure of claim 1, wherein:
the p-doped semiconductor gate electrode and the n-doped semiconductor gate electrode have a substantially same semiconductor gate electrode thickness; and
the first metallic gate electrode and the second metallic gate electrode have a same material composition and a same metallic gate electrode thickness.

6. The semiconductor structure of claim 1, wherein:
the first interfacial dielectric layer comprises silicon oxide;
the p-doped semiconductor gate electrode comprises boron-doped polysilicon; and
the n-doped semiconductor gate electrode comprises n-doped polysilicon.

7. The semiconductor structure of claim 6, wherein the first metallic gate electrode and the second metallic gate electrode consist essentially of a metal silicide.

8. The semiconductor structure of claim 1, wherein an interfacial resistivity between the p-doped semiconductor gate electrode and the first metallic gate electrode is less than $1.0 \times 10^4$ Ohm-micron$^2$.

9. The semiconductor structure of claim 1, wherein the first field effect transistor comprises a PMOS transistor of a CMOS and the second field effect transistor comprises a NMOS transistor of the CMOS.

10. The semiconductor structure of claim 9, wherein the CMOS comprises part of a driver circuit of a three dimensional vertical NAND memory device which is located over the CMOS.

11. A method of forming a semiconductor structure, comprising:
forming a continuous gate dielectric layer and a gate semiconductor layer over a top surface of a semiconductor substrate;
forming a p-doped semiconductor region and an n-doped semiconductor region in the gate semiconductor layer by doping portions of the gate semiconductor layer with at least one of p-type dopants or n-type dopants;
forming an interfacial dielectric material on the p-doped semiconductor region and on the n-doped semiconductor region;
removing a second portion of the interfacial dielectric material from above the n-doped semiconductor region while covering a first portion of the interfacial dielectric material located above the p-doped semiconductor region with an etch mask layer;
forming a metallic gate layer over the first portion of the interfacial dielectric material, the p-doped semiconductor region, and the n-doped semiconductor region after removing the etch mask layer; and
patterning the metallic gate layer, the second portion of the interfacial dielectric material, the p-doped semiconductor region, and the n-doped semiconductor region.

12. The method of claim 11, wherein patterning the metallic gate layer, the second portion of the interfacial dielectric material, the p-doped semiconductor region, and the n-doped semiconductor region forms:
a first composite gate electrode including a first vertical stack of a p-doped semiconductor gate electrode including a remaining portion of the p-doped semiconductor region, a first interfacial dielectric layer having a first thickness and including a remaining portion of the second portion of the interfacial dielectric material, and a first metallic gate electrode including a portion of the metallic gate layer; and
a second composite gate electrode including a second vertical stack comprising an n-doped semiconductor gate electrode including a remaining portion of the n-doped semiconductor region and a second metallic gate electrode including another portion of the metallic gate layer,
wherein an interfacial region between the n-doped semiconductor gate electrode and the second metallic gate electrode has a configuration selected from:
a first configuration in which a second interfacial dielectric layer having a second thickness that is lesser than the first thickness contacts a surface of the n-doped semiconductor gate electrode and a surface of the second metallic gate electrode; and
a second configuration in which a surface of the n-doped semiconductor gate electrode contacts a surface of the second metallic gate electrode.

13. The method of claim 12, wherein the interfacial dielectric material is formed by thermal oxidation of surface portions of the p-doped semiconductor region and the n-doped semiconductor region.

14. The method of claim 13, wherein:
the first portion of the interfacial dielectric material comprises a first thermal silicon oxide having a p-type doping and located on the p-doped semiconductor region; and
the second portion of the interfacial dielectric material comprises a second thermal silicon oxide having an n-type doping and located on the n-doped semiconductor region.

15. The method of claim 12, further comprising performing a thermal or plasma oxidation process after removing the etch mask layer and prior to the forming the metallic gate layer, wherein:
the interfacial region between the n-doped semiconductor gate electrode and the second metallic gate electrode has the first configuration;
the first interfacial dielectric layer includes a region of the first portion of the interfacial dielectric material and a silicon oxide material derived from oxidation of a surface portion of the p-doped semiconductor region that underlies the first portion of the interfacial dielectric material prior to the thermal or plasma oxidation process; and
the second interfacial dielectric layer includes a silicon oxide material derived from oxidation of a surface portion of the n-doped semiconductor region that is physically exposed after removal of the etch mask layer and prior to the thermal or plasma oxidation process.

16. The method of claim 12, wherein:
the p-doped semiconductor gate electrode comprises boron-doped polysilicon; and
the n-doped semiconductor gate electrode comprises n-doped polysilicon.

17. The method of claim 12, wherein:
the interfacial region between the n-doped semiconductor gate electrode and the second metallic gate electrode has the first configuration;
the first thickness is in a range from 0.5 nm to 1.5 nm; and
the second thickness is in a range from 0.3 nm to 0.8 nm.

18. The method of claim 12, wherein:
the metallic gate layer is formed directly on the first portion of the interfacial dielectric material and the n-doped semiconductor region; and
the interfacial region between the n-doped semiconductor gate electrode and the second metallic gate electrode has the second configuration.

19. The method of claim 12, wherein:
- the p-doped semiconductor gate electrode and the n-doped semiconductor gate electrode have a substantially same semiconductor gate electrode thickness;
- the first metallic gate electrode and the second metallic gate electrode have a same material composition and a same metallic gate electrode thickness; and
- the first metallic gate electrode and the second metallic gate electrode consist essentially of a metal silicide.

20. The method of claim 11, wherein the semiconductor structure comprises a CMOS that is part of a driver circuit of a three dimensional vertical NAND memory device which is located over the CMOS.

\* \* \* \* \*